(12) United States Patent
Song et al.

(10) Patent No.: US 12,402,447 B2
(45) Date of Patent: Aug. 26, 2025

(54) DISPLAY DEVICE AND METHOD OF MANUFACTURING THE SAME

(71) Applicant: Samsung Display Co., LTD., Yongin-si (KR)

(72) Inventors: Myeong Hun Song, Pyeongtaek-si (KR); Je Min Lee, Asan-si (KR); Eun Je Jang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 457 days.

(21) Appl. No.: 17/994,637

(22) Filed: Nov. 28, 2022

(65) Prior Publication Data

US 2023/0317886 A1 Oct. 5, 2023

(30) Foreign Application Priority Data

Mar. 31, 2022 (KR) .......................... 10-2022-0040470

(51) Int. Cl.
*H10H 20/831* (2025.01)
*H10H 20/01* (2025.01)
*H10H 20/857* (2025.01)
*H10H 29/14* (2025.01)

(52) U.S. Cl.
CPC ........ *H10H 20/8316* (2025.01); *H10H 20/01* (2025.01); *H10H 20/857* (2025.01); *H10H 29/142* (2025.01); *H10H 20/032* (2025.01); *H10H 20/0364* (2025.01)

(58) Field of Classification Search
CPC .. H10H 20/8316; H10H 20/01; H10H 20/857; H10H 29/142; H10H 20/0364; H10H 20/032; H10H 20/819; H10H 20/034; H10H 20/83; G09G 3/30; H01L 25/167; H01L 25/0753; H10D 86/021; H10D 86/451

See application file for complete search history.

(56) References Cited

U.S. PATENT DOCUMENTS

| | | | | |
|---|---|---|---|---|
| 12,219,823 | B2 * | 2/2025 | Kim | ...................... H10H 20/857 |
| 12,279,481 | B2 * | 4/2025 | Park | ...................... H10H 29/142 |
| 2021/0335883 | A1 * | 10/2021 | Park | .......................... G09G 3/32 |

(Continued)

FOREIGN PATENT DOCUMENTS

| KR | 10-2021-0008252 | 1/2021 |
|---|---|---|
| KR | 10-2023-0006669 | 1/2023 |

*Primary Examiner* — Victor A Mandala
(74) *Attorney, Agent, or Firm* — Womble Bond Dickinson (US) LLP

(57) ABSTRACT

A display device comprises at least one first electrode, at least one second electrode, a first insulating layer, a light emitting element disposed between the at least one first electrode and the at least one second electrode on the first insulating layer, the light emitting element including an end and another end opposite to the end, and a second insulating layer disposed on the light emitting element and exposing the end and the another end of the light emitting element. The second insulating layer includes a first main open portion exposing the end of the light emitting element and extended in a first direction, a second main open portion exposing the another end of the light emitting element and extended in the first direction, and a sub-open portion connecting the first main open portion with the second main open portion in a plan view and extended in a second direction.

20 Claims, 25 Drawing Sheets

(56) References Cited

U.S. PATENT DOCUMENTS

| | | | |
|---|---|---|---|
| 2021/0376196 A1* | 12/2021 | Lee | H01L 25/0753 |
| 2022/0293672 A1* | 9/2022 | Kim | H10H 29/142 |
| 2022/0302235 A1* | 9/2022 | Kim | H10K 59/124 |
| 2022/0320378 A1* | 10/2022 | Hong | H01L 25/0753 |
| 2022/0328528 A1* | 10/2022 | Lee | H01L 25/167 |
| 2023/0006175 A1 | 1/2023 | Kim et al. | |
| 2023/0187584 A1* | 6/2023 | Kim | H10H 20/857 |
| | | | 257/79 |

* cited by examiner

DISPLAY DEVICE AND METHOD OF MANUFACTURING THE SAME

CROSS-REFERENCE TO RELATED APPLICATION

This application claims priority to and benefits of Korean Patent Application No. 10-2022-0040470 under 35 U.S.C. § 119, filed in the Korean Intellectual Property Office on Mar. 31, 2022, the entire contents of which are incorporated herein by reference.

BACKGROUND

1. Technical Field

The disclosure relates a display device and a method of manufacturing the same, which is capable of preventing an upper connection electrode from being disconnected due to agglomeration of light emitting elements or particles.

2. Description of the Related Art

The importance of display devices as communication media, has been emphasized because of increasing developments of information technology. Also, various types of display devices such as an organic light emitting diode display (OLED) device and a liquid crystal display (LCD) device have been increasing and becoming more popular.

There is a self-light emitting display device that includes a light emitting element as a device for displaying an image of a display device. Examples of the self-light emitting display device include an organic light emitting display device that uses an organic material as a light emitting material and an inorganic light emitting display device that uses an inorganic material as a light emitting material.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device capable of preventing an upper connection electrode from being disconnected due to agglomeration of light emitting elements or particles.

Embodiments also provide a method of manufacturing a display device, capable of preventing an upper connection electrode from being disconnected due to agglomeration of light emitting elements or particles.

However, embodiments of the disclosure are not limited to those set forth herein. The above and other embodiments will become more apparent to one of ordinary skill in the art to which the disclosure pertains by referencing the detailed description of the disclosure given below.

According to an embodiment of the disclosure, a display device comprising: a bank layer extended in a first direction and a second direction intersecting the first direction on a substrate, and adjacent to a plurality of subpixels, at least one first electrode extended in the first direction from each of the plurality of subpixels on the bank layer, at least one second electrode spaced apart from the at least one first electrode on the bank layer in the second direction and extended in the first direction, a first insulating layer on the at least one first electrode and the at least one second electrode, a light emitting element disposed between the at least one first electrode and the at least one second electrode on the first insulating layer, the light emitting element including an end and another end opposite to the end, and a second insulating layer disposed on the light emitting element and exposing the end and the another end of the light emitting element. The second insulating layer includes a first main open portion exposing the end of the light emitting element and extended in the first direction, a second main open portion exposing the another end of the light emitting element and extended in the first direction, and a sub-open portion connecting the first main open portion with the second main open portion in a plan view and extended in the second direction.

The first main open portion may overlap the at least one second electrode in a plan view, and the second main open portion may overlap the at least one first electrode in a plan view.

The at least one second electrode may include a plurality of second electrodes, and the at least one first electrode may be disposed between adjacent ones of the plurality of second electrodes adjacent to each other.

The at least one first electrode may include a plurality of first electrodes, and a second electrode of the plurality of second electrodes may be disposed between adjacent ones of the plurality of first electrodes adjacent to each other.

The sub-open portion may include a first sub-open portion disposed between a second electrode of the plurality of second electrodes at another side of each of the plurality of subpixels in the second direction and a first electrode of the plurality of first electrodes at the another side of each of the plurality of subpixels in the second direction, and a second sub-open portion disposed between a second electrode of the plurality of second electrodes at a side of each of the plurality of subpixels in the second direction and a first electrode of the plurality of first electrodes at the side of each of the plurality of subpixels in the second direction.

The display device may further comprise a first connection electrode on the second insulating layer and a second connection electrode spaced apart from the first connection electrode. The first connection electrode may include a 1-1-th electrode portion extended in the first direction, a 1-2-th electrode portion extended in the first direction, and a 1-3-th electrode portion electrically connecting the 1-1-th electrode portion with the 1-2-th electrode portion. The 1-1-th electrode portion may overlap an upper end of the second electrode of the plurality of second electrodes at the another side of each of the plurality of subpixels in the second direction. The 1-2-th electrode portion may overlap a lower end of the first electrode of the plurality of first electrodes at the another side of each of the plurality of subpixels in the second direction.

The sub-open portion of the second insulating layer may further include a third sub-open portion overlapping the 1-3-th electrode portion in a plan view.

The second connection electrode may include a 2-1-th electrode portion extended in the first direction, a 2-2-th electrode portion extended in the first direction, and a 2-3-th electrode portion electrically connecting the 2-1-th electrode portion with the 2-2-th electrode portion. The 2-1-th electrode portion may overlap an upper end of the second electrode of the plurality of second electrodes at the side of each of the plurality of subpixels in the second direction. The 2-2-th electrode portion may overlap a lower end of the first electrode of the plurality of first electrodes at the side of each of the plurality of subpixels in the second direction.

The sub-open portion of the second insulating layer may further include a fourth sub-open portion overlapping the 2-3-th electrode portion in a plan view.

The sub-open portion of the second insulating layer may further include a fifth sub-open portion extended in the second direction and overlapping the plurality of first electrodes and the second electrode of the plurality of second electrodes positioned at the side of each of the plurality of subpixels in the second direction in a plan view.

The display device may further comprise a third connection electrode disposed on the first connection electrode and the second connection electrode. The third connection electrode may include a 3-1-th electrode portion between the 1-1-th electrode portion and the 2-1-th electrode portion, a 3-2-th electrode portion spaced apart from the 3-1-th electrode portion, and a 3-3-th electrode portion electrically connecting the 3-1-th electrode portion with the 3-2-th electrode portion. The 2-1-th electrode portion may be disposed between the 3-2-th electrode portion and the 3-1-th electrode portion.

The fifth sub-open portion may overlap the 3-3-th electrode portion in a plan view.

According to an embodiment of the disclosure, a method of manufacturing a display device, the method comprises forming a bank layer extended in a first direction and a second direction intersecting the first direction on a substrate, and adjacent to a plurality of subpixels, forming at least one first electrode extended in the first direction from each of the plurality of subpixels on the bank layer and at least one second electrode spaced apart from the at least one first electrode on the bank layer in the second direction and extended in the first direction, forming a first insulating layer on the at least one first electrode and the at least one second electrode, disposing a light emitting element between the at least one first electrode and the at least one second electrode on the first insulating layer, the light emitting element including an end and another end opposite to the end, and forming a second insulating layer on the light emitting element. The forming of the second insulating layer includes forming a first main open portion exposing the end of the light emitting element, and extended in the first direction, and forming a sub-open portion extended and diverged from the first main open portion in the second direction in a plan view.

The first main open portion may overlap the at least one second electrode in a plan view.

The at least one second electrode may include a plurality of second electrodes, and the at least one first electrode may be disposed between adjacent ones of the second electrodes adjacent to each other. The at least one first electrode may include a plurality of first electrodes, and a second electrode of the plurality of second electrodes may be disposed between adjacent ones of the plurality of first electrodes adjacent to each other.

The sub-open portion may include a first sub-open portion disposed between a second electrode of the plurality of second electrodes at another side of each of the plurality of subpixels in the second direction and a first electrode of the plurality of first electrodes at the another side of each of the plurality of subpixels in the second direction, and a second sub-open portion disposed between a second electrode of the plurality of second electrodes at a side of each of the plurality of subpixels in the second direction and a first electrode of the plurality of first electrodes at the side of each of the plurality of subpixels in the second direction.

The method may further comprise forming a first connection electrode on the second insulating layer and a second connection electrode spaced apart from the first connection electrode after the forming of the second insulating layer. The first connection electrode may include a 1-1-th electrode portion extended in the first direction, a 1-2-th electrode portion extended in the first direction, and a 1-3-th electrode portion electrically connecting the 1-1-th electrode portion with the 1-2-th electrode portion. The 1-1-th electrode portion may overlap an upper end of the second electrode of the plurality of second electrodes at the another side of each of the plurality of subpixels in the second direction. The 1-2-th electrode portion may overlap a lower end of the first electrode of the plurality of first electrodes at the another side of each of the plurality of subpixels in the second direction.

The sub-open portion of the second insulating layer may further include a third sub-open portion overlapping the 1-3-th electrode portion in a plan view.

The second connection electrode may include a 2-1-th electrode portion extended in the first direction, a 2-2-th electrode portion extended in the first direction, and a 2-3-th electrode portion electrically connecting the 2-1-th electrode portion with the 2-2-th electrode portion. The 2-1-th electrode portion may overlap an upper end of the second electrode of the plurality of second electrodes at the side of each of the plurality of subpixels in the second direction. The 2-2-th electrode portion may overlap a lower end of the first electrode of the plurality of first electrodes at the side of each of the plurality of subpixels in the second direction.

The sub-open portion of the second insulating layer may further include a fourth sub-open portion overlapping the 2-3-th electrode portion in a plan view, and a fifth sub-open portion extended in the second direction and overlapping the plurality of first electrodes and the second electrode of the plurality of second electrodes positioned at the side of each of the plurality of subpixels in the second direction in a plan view.

Details of the other embodiments are included in the detailed description and drawings.

In the display device and the method of manufacturing the same according to one embodiment of the disclosure, when a second insulating layer is formed, additional open pattern may be further formed to prevent a disconnection of an upper connection electrode due to agglomeration of light emitting elements or particles.

The effects according to the embodiments of the disclosure are not limited to those mentioned above and more various effects are included in the following description of the disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
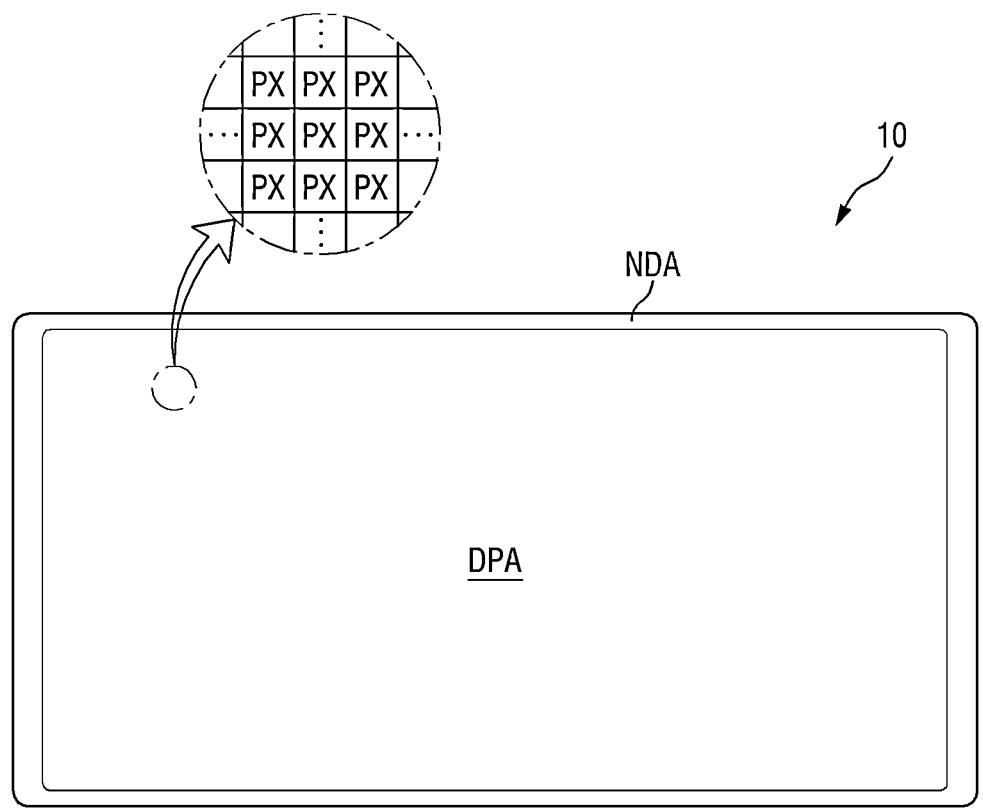
FIG. 1 is a schematic plan view illustrating a display device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various types of elements, these elements should not be limited by these terms. These terms are only used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments are described with reference to the accompanying drawings.

FIG. 1 is a schematic plan view illustrating a display device according to an embodiment of the disclosure.

Referring to FIG. 1, a display device 10 may display a moving image or a still image. The display device 10 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like, which provide a display screen, may be included in the display device 10.

The display device 10 may include a display panel for providing the display screen. Examples of the display panel include an inorganic light emitting diode display panel, an organic light emitting display panel, a quantum dot light emitting display panel, a plasma display panel, a field emission display panel, or the like. Hereinafter, for convenience of explanation, description of the inorganic light emitting diode display panel applied to the display panel is provided below, but disclosure is not limited thereto. Other display panels may be used when the same technical spirits are applicable thereto.

Various modifications may be made in a shape of the display device 10. For example, the display device 10 may have a rectangular shape that is long in a horizontal direction, a rectangular shape that is long in a vertical direction, a square shape, a square shape with rounded corners (or vertexes), other polygonal shapes, a circular shape, etc. A shape of a display area DPA of the display device 10 may be also similar to the overall shape of the display device 10. In FIG. 1, a rectangular display device 10 that is longer in a second direction DR2 is illustrated.

The display device 10 may include the display area DPA and a non-display area NDA. The display area DPA may be an area in which a screen may be displayed, and the non-display area NDA may be an area in which a screen is not displayed. The display area DPA may be referred to as an active area, and the non-display area NDA may be referred to as a non-active area. The display area DPA may generally occupy a center of the display device 10.

The display area DPA may include pixels PX. The pixels PX may be disposed in a matrix direction (or in a matrix arrangement). A shape of each pixel PX may be a rectangular or square shape in a plan view, but is not limited thereto. The shape of each pixel PX may be a rhombus shape in which each side is inclined with respect to a direction. The respective pixels PX may be disposed in a stripe type or an island type. Also, each of the pixels PX may include one or more light emitting elements for emitting light of a wavelength band (e.g., a specific or selectable wavelength band) to display a color (e.g., a specific or selectable color).

The non-display area NDA may be disposed in the vicinity of (or adjacent to) the display area DPA. The non-display area NDA may be adjacent to (e.g., fully or partially surround) the display area DPA. The display area DPA may be rectangular in shape, and the non-display area NDA may be adjacent to four sides of the display area DPA. The non-display area NDA may constitute a bezel of the display device 10. Lines or circuit drivers included in the display device 10 may be disposed in the non-display areas NDA, or external devices may be packaged therein.

Figure 2:
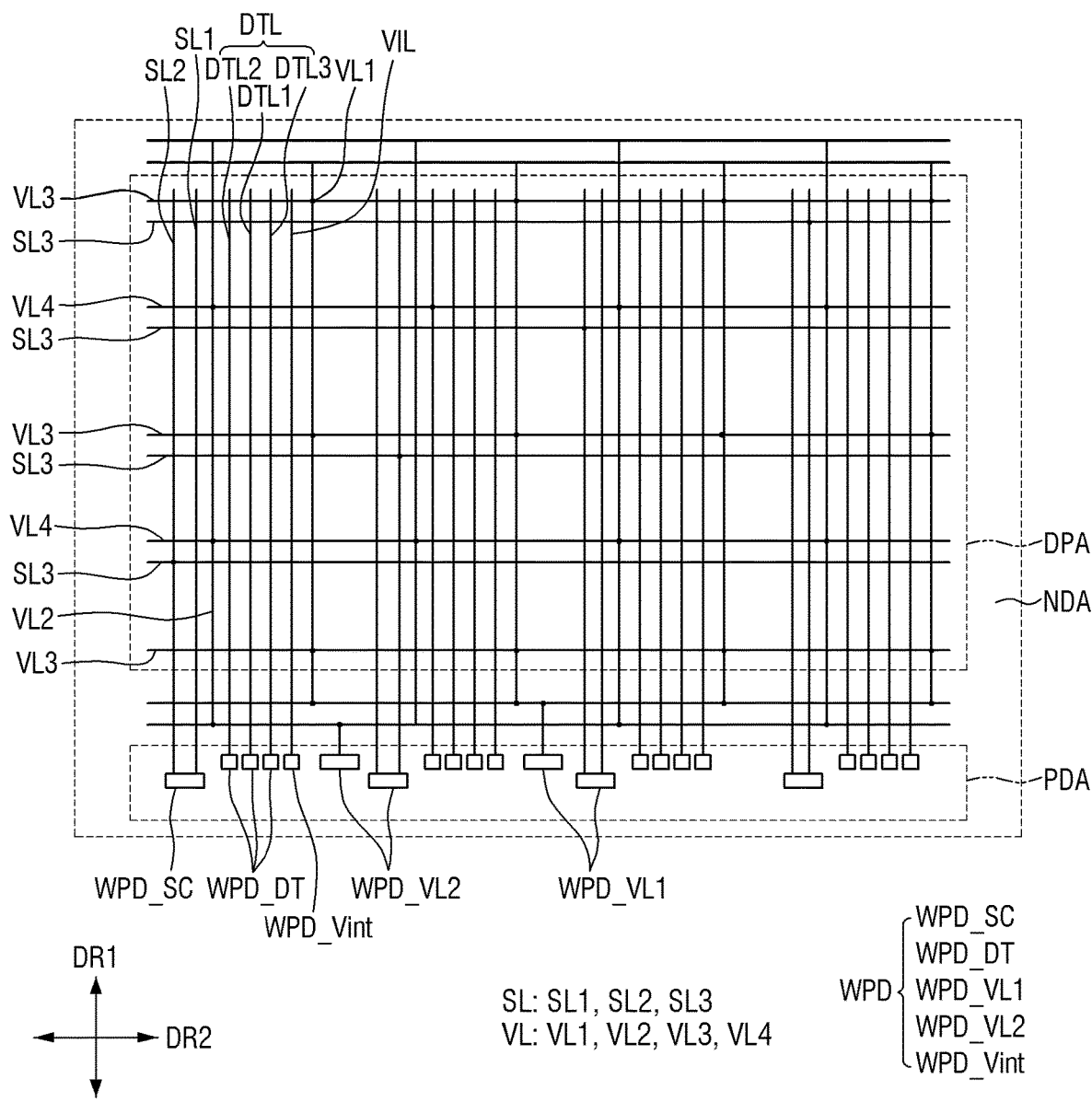
FIG. 2 is a schematic plan view illustrating arrangement of lines of a display device according to an embodiment of the disclosure.

FIG. 2 is a schematic layout view illustrating lines of a display device according to an embodiment of the disclosure.

Referring to FIG. 2, the display device 10 may include lines. The display device 10 may include scan lines SL (e.g., first to third scan lines SL1, SL2 and SL3), data lines DTL (e.g., first to third data lines DTL1, DTL2 and DTL3), an initialization voltage line VIL, and voltage lines VL (e.g., first to fourth voltage lines VL1, VL2, VL3 and VL4). Also, although not shown in the drawings, the display device 10 may further include other lines. The lines may include lines made of a first conductive layer and extended in a first direction DR1 and lines made of a third conductive layer and extended in a second direction DR2, but the extended directions of the respective lines are not limited thereto.

The first scan line SL1 and the second scan line SL2 may be extended in the first direction DR1. The first scan line SL1 and the second scan line SL2 may be adjacent to each other, and may be spaced apart from another first scan line SL1 and another second scan line SL2 in the second direction DR2. The first scan line SL1 and the second scan line SL2 may be electrically connected with a scan line pad WPD_SC electrically connected to a scan driver (not shown). The first scan line SL1 and the second scan line SL2 may be extended from a pad area PDA disposed in the non-display area NDA to the display area DPA.

The third scan line SL3 may be extended in the second direction DR2, and may be spaced apart from another third scan line SL3 in the first direction DR1. Each third scan line SL3 may be electrically connected to one or more first scan lines SL1 or one or more second scan lines SL2. The scan lines SL may have a mesh structure on a front surface of the display area DPA, but are not limited thereto.

The meaning of "connection" herein may include connection of any one member to another member through a third member as well as through a mutual physical (or electrical) contact. Further, it may be understood that a portion and the other portion are interconnected as an integrated member. Furthermore, the connection of any one member to another member may be interpreted in terms of including electrical connection through other member in addition to direct contact connection.

The data lines DTL may be extended in the first direction DR1. The data line DTL may include a first data line DTL1, a second data line DTL2, and a third data line DTL3. The first to third data lines DTL1, DTL2 and DTL3 may be adjacent to one another and form a pair. For example, each first data line DTL1, each second data line DTL2, and each third data line DTL3 may be grouped to form the pair. Each of the data lines DTL1, DTL2 and DTL3 may be extended from the pad area PDA disposed in the non-display area NDA to the display area DPA, but is not limited thereto. The data lines DTL may be spaced apart from each other at constant intervals between the first voltage line VL1 and the second voltage line VL2. Detailed description of the first voltage line VL1 and the second voltage line VL2 is provided below.

The initialization voltage line VIL may be extended in the first direction DR1. The initialization voltage line VIL may be disposed between the data lines DTL and the first voltage line VL1. The initialization voltage line VIL may be extended from the pad area PDA disposed in the non-display area NDA to the display area DPA.

The first voltage line VL1 and the second voltage line VL2 may be extended in the first direction DR1, and the third voltage line VL3 and the fourth voltage line VL4 may be extended in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be extended in the first direction DR1 and intersect (or cross) the display area DPA. A portion of the third voltage line VL3 and the fourth voltage line VL4 may be disposed in the display area DPA and another portion thereof may be disposed in the non-display area NDA positioned on both sides of the display area DPA in the first direction DR1. The first voltage line VL1 and the second voltage line VL2 may be formed of a first conductive layer, and the third voltage line VL3 and the fourth voltage line VL4 may be formed of a third conductive layer disposed on a layer different from the first conductive layer. The first voltage line VL1 may be electrically connected to at least one third voltage line VL3, and the second voltage line VL2 may be electrically connected to at least one fourth voltage line VL4. The voltage lines VL may have a mesh structure on the front surface of the display area DPA, but are not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In an embodiment, each line pad WPD may be disposed in the pad area PDA positioned at a lower side of the display area DPA, which is another side of the display area DPA in the first direction DR1. The first scan line SL1 and the second scan line SL2 may be electrically connected to the scan line pad WPD_SC disposed in the pad area PDA. The data lines DTL may be electrically connected to respective data line pads WPD DT different from each other. The initialization voltage line VIL may be electrically connected to an initialization line pad WPD_Vint. The first voltage line VL1 may be electrically connected to a first voltage line pad WPD_VL1. The second voltage line VL2 may be electrically connected to a second voltage line pad WPD_VL2. An external device may be packaged on the line pad WPD. The external device may be packaged on the line pad WPD through an anisotropic conductive film, an ultrasonic bonding, or the like. Each line pad WPD may be disposed in the pad area PDA disposed at the lower side of the display area DPA, but is not limited thereto. A portion of the line pads WPD may be disposed on at least one of an upper side, a left side, and a right side of the display area DPA.

Each pixel PX (or subpixel SPXn, n is an integer of 1 to 3) of the display device 10 may include a pixel driving circuit. The above-described lines may apply a driving signal to each pixel driving circuit and pass through each pixel PX or a periphery of the pixel PX. The pixel driving circuit may include a transistor and a capacitor. Various modifications may be made in the number of transistors and capacitors of each pixel driving circuit. According to an embodiment, the subpixel SPXn of the display device 10 may have a 3T1C structure in which a pixel driving circuit includes three transistors and a capacitor. Hereinafter, for convenience of explanation, the pixel driving circuit is described based on the 3T1C structure as an example, but is not limited thereto. Other various modified pixel structures, such as a 2T1C structure, a 7T1C structure, a 6T1C structure, or the like may be applied to the pixel driving circuit.

Figure 3:
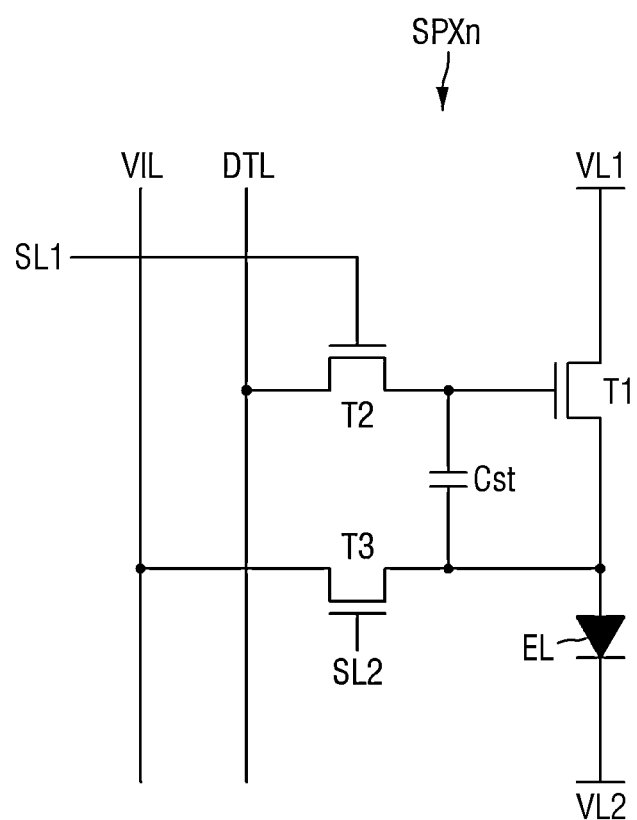
FIGS. 3 and 4 are schematic diagrams of equivalent circuits illustrating a pixel of a display device according to an embodiment of the disclosure.
Figure 4:
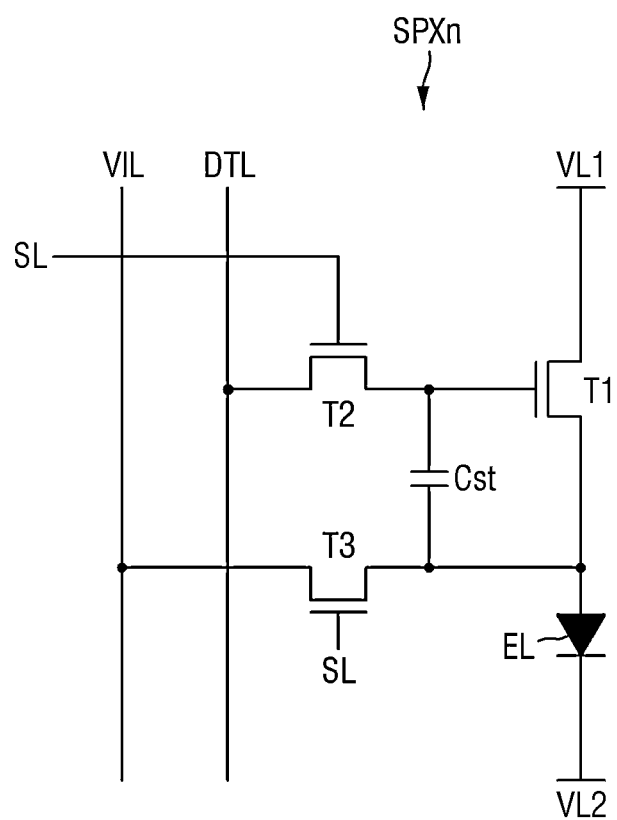

FIGS. 3 and 4 are schematic diagrams of equivalent circuits illustrating a pixel of a display device according to an embodiment of the disclosure.

Referring to FIG. 3, each subpixel SPXn of the display device 10 according to an embodiment may include three transistors T1, T2 and T3, a storage capacitor Cst, and a light emitting diode EL.

The light emitting diode EL may emit light in accordance with a current supplied through a first transistor T1. The light emitting diode EL may include a first electrode, a second electrode, and at least one light emitting element disposed between the first electrode and the second electrode. The light emitting element may emit light of a wavelength band (e.g., a specific or selectable wavelength band) by an electrical signal transferred from the first electrode and the second electrode.

An end of the light emitting diode EL may be electrically connected to a source electrode of the first transistor T1, and another end thereof may be electrically connected to the second voltage line VL2 to which a low potential voltage (hereinafter, referred to as "second power voltage") lower than a high potential voltage (hereinafter, referred to as "first power voltage") of a first voltage line VL1 is supplied.

The first transistor T1 may adjust the current flowing from the first voltage line VL1, to which the first power voltage is supplied, to the light emitting diode EL in accordance with a voltage difference between a gate electrode and the source electrode thereof. For example, the first transistor T1 may be a driving transistor for driving the light emitting diode EL. The gate electrode of the first transistor T1 may be electrically connected to a source electrode of a second transistor T2, the source electrode thereof may be electrically connected to a first electrode of the light emitting diode EL, and a drain electrode thereof may be electrically connected to the first voltage line VL1 to which the first power voltage is applied.

The second transistor T2 may be turned on by a scan signal of the first scan line SL1 and electrically connect the data line DTL to the gate electrode of the first transistor T1. A gate electrode of the second transistor T2 may be electrically connected to the first scan line SL1, the source electrode thereof may be electrically connected to the gate electrode of the first transistor T1, and a drain electrode thereof may be electrically connected to the data line DTL.

A third transistor T3 may be turned on by a scan signal of the second scan line SL2 and electrically connect the initialization voltage line VIL to an end of the light emitting diode EL. A gate electrode of the third transistor T3 may be electrically connected to the second scan line SL2, a drain electrode thereof may be electrically connected to the initialization voltage line VIL, and a source electrode thereof may be electrically connected to an end of the light emitting diode EL or the source electrode of the first transistor T1.

In an embodiment, the source electrode and the drain electrode of each of the transistors T1, T2 and T3 are not limited to those described above, and vice versa. Each of the transistors T1, T2 and T3 may be formed of a thin film transistor. In FIG. 3, each of the transistors T1, T2 and T3 is formed of an N-type metal oxide semiconductor field effect transistor (MOSFET), but is not limited thereto. Each of the transistors T1, T2 and T3 may be formed of a P-type MOSFET, or a portion of the transistors T1, T2 and T3 may be an N-type MOSFET, and another portion thereof may be formed of a P-type MOSFET.

The storage capacitor Cst may be formed between the gate electrode and the source electrode of the first transistor T1. The storage capacitor Cst may store a differential voltage (or voltage difference) between a gate voltage and a source voltage of the first transistor T1.

In the embodiment of FIG. 3, the gate electrode of the second transistor T2 may be electrically connected to the first scan line SL1, and the gate electrode of the third transistor T3 may be electrically connected to the second scan line SL2. The first scan line SL1 and the second scan line SL2 may be scan lines different from each other, and the second transistor T2 and the third transistor T3 may be turned on by scan signals applied from different scan lines SL1 and SL2, but are not limited thereto.

Referring to FIG. 4, the gate electrodes of the second transistor T2 and the third transistor T3 may be electrically connected to a same scan line SL. The second transistor T2 and the third transistor T3 may be simultaneously turned on by a scan signal applied from the same scan line SL.

Hereinafter, a structure of a subpixel SPXn of the display device 10 according to an embodiment of the disclosure is described in detail with reference to other drawings.

Figure 5:
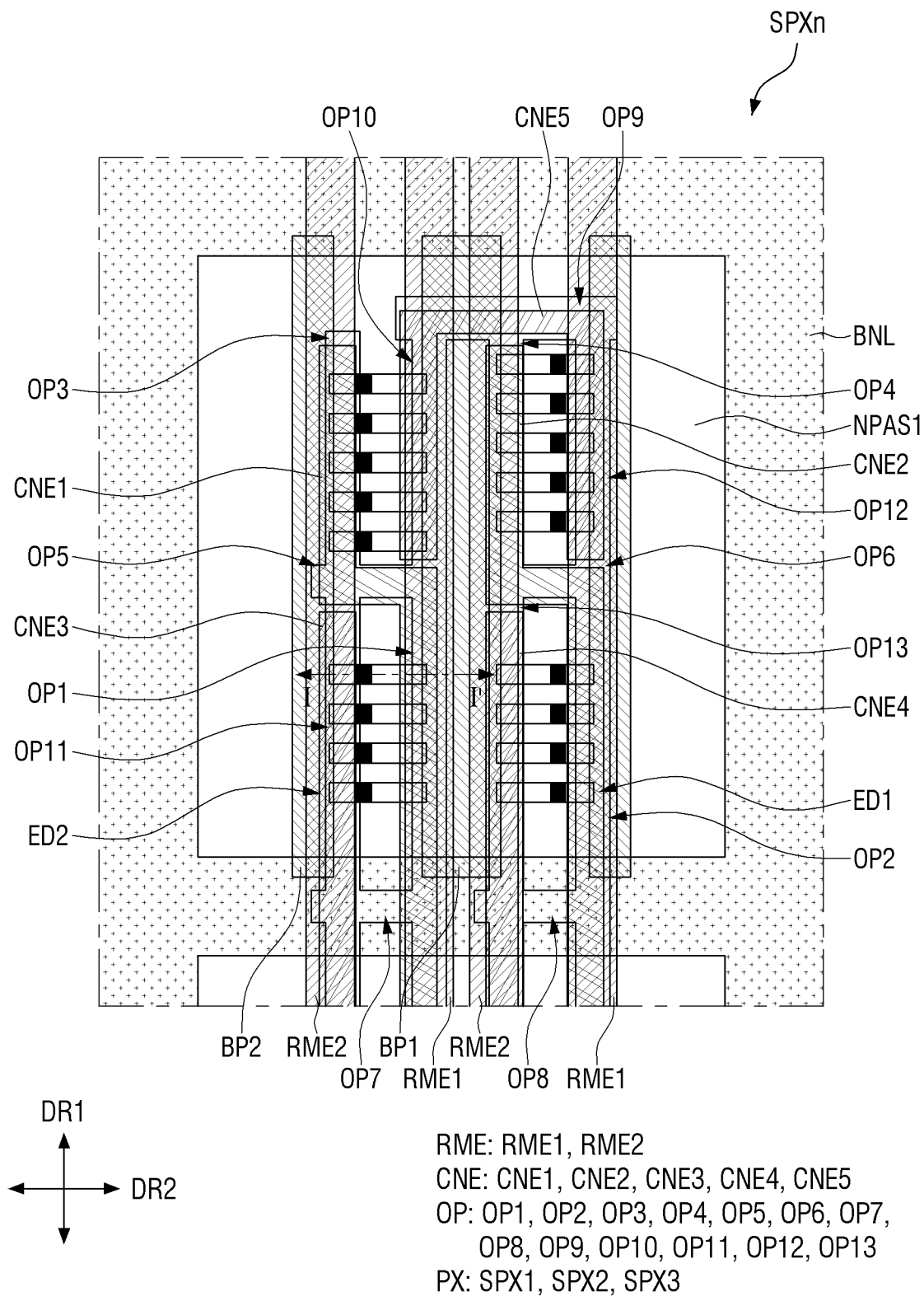
FIG. 5 is a schematic plan view illustrating a subpixel of a display device according to an embodiment of the disclosure.
Figure 6:
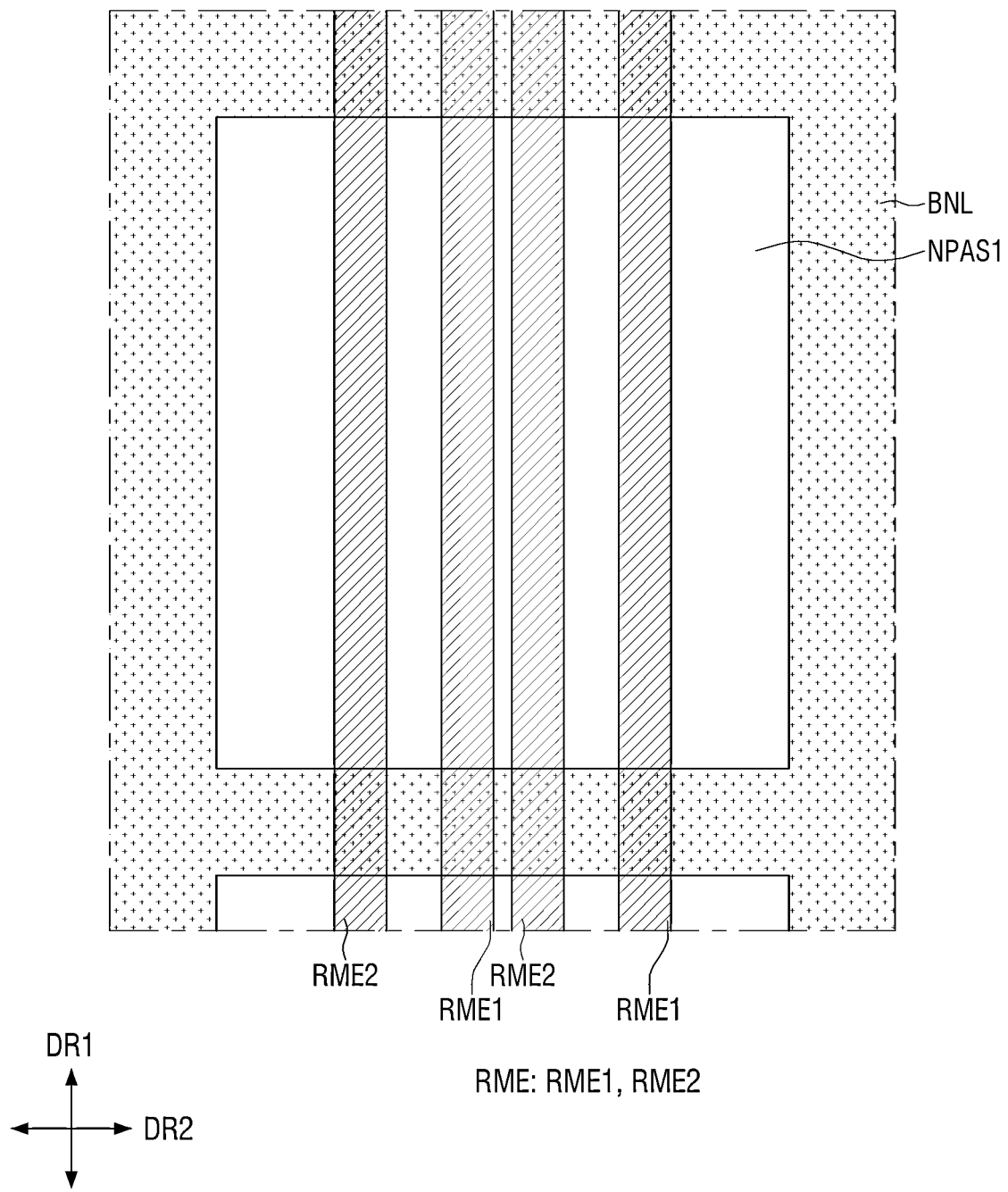
FIG. 6 is a schematic plan view illustrating arrangement of electrodes and a bank layer, which are disposed in a subpixel of FIG. 5.
Figure 7:
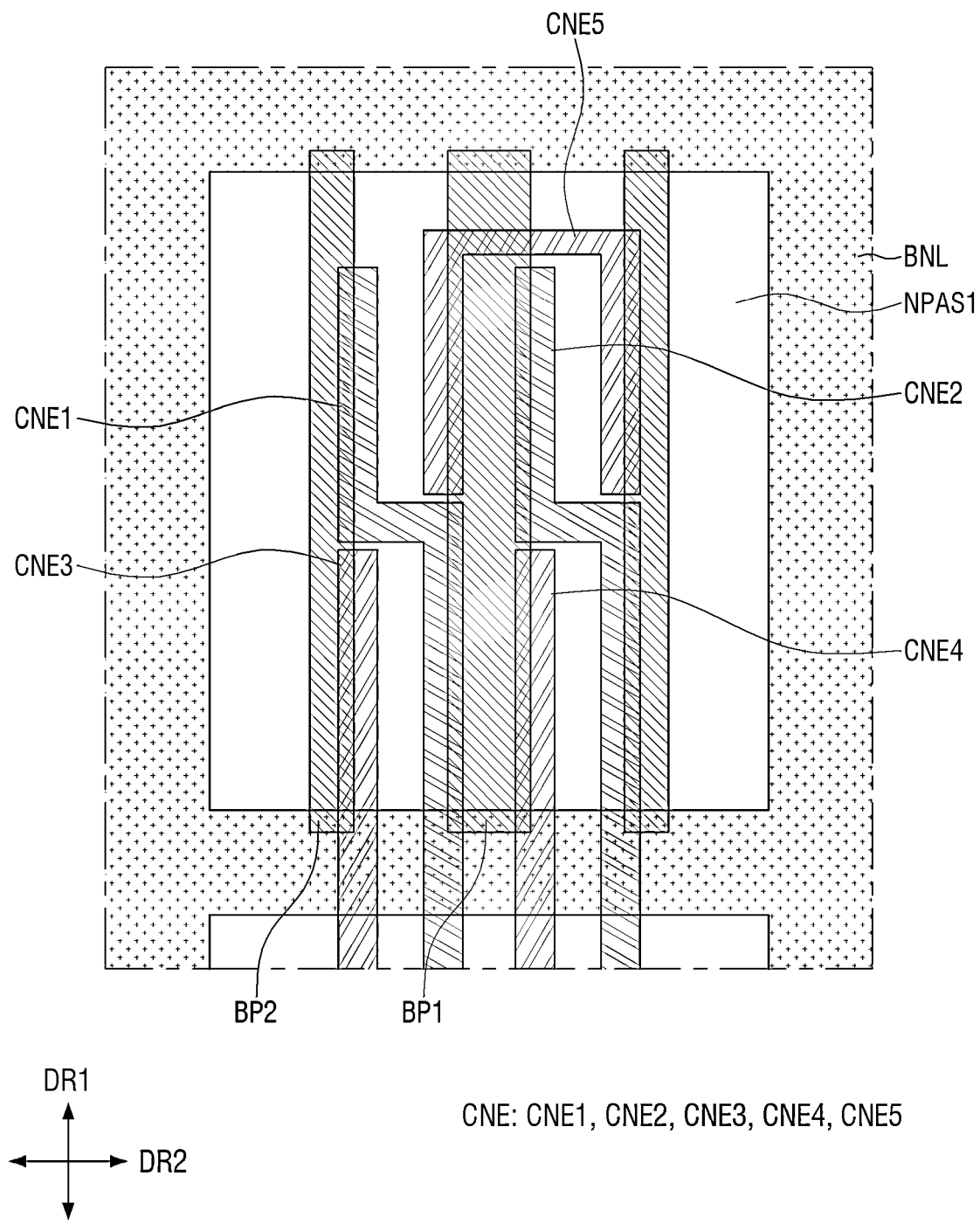
FIG. 7 is a schematic plan view illustrating arrangement of connection electrodes and a bank layer, which are disposed in a subpixel of FIG. 5.
Figure 8:
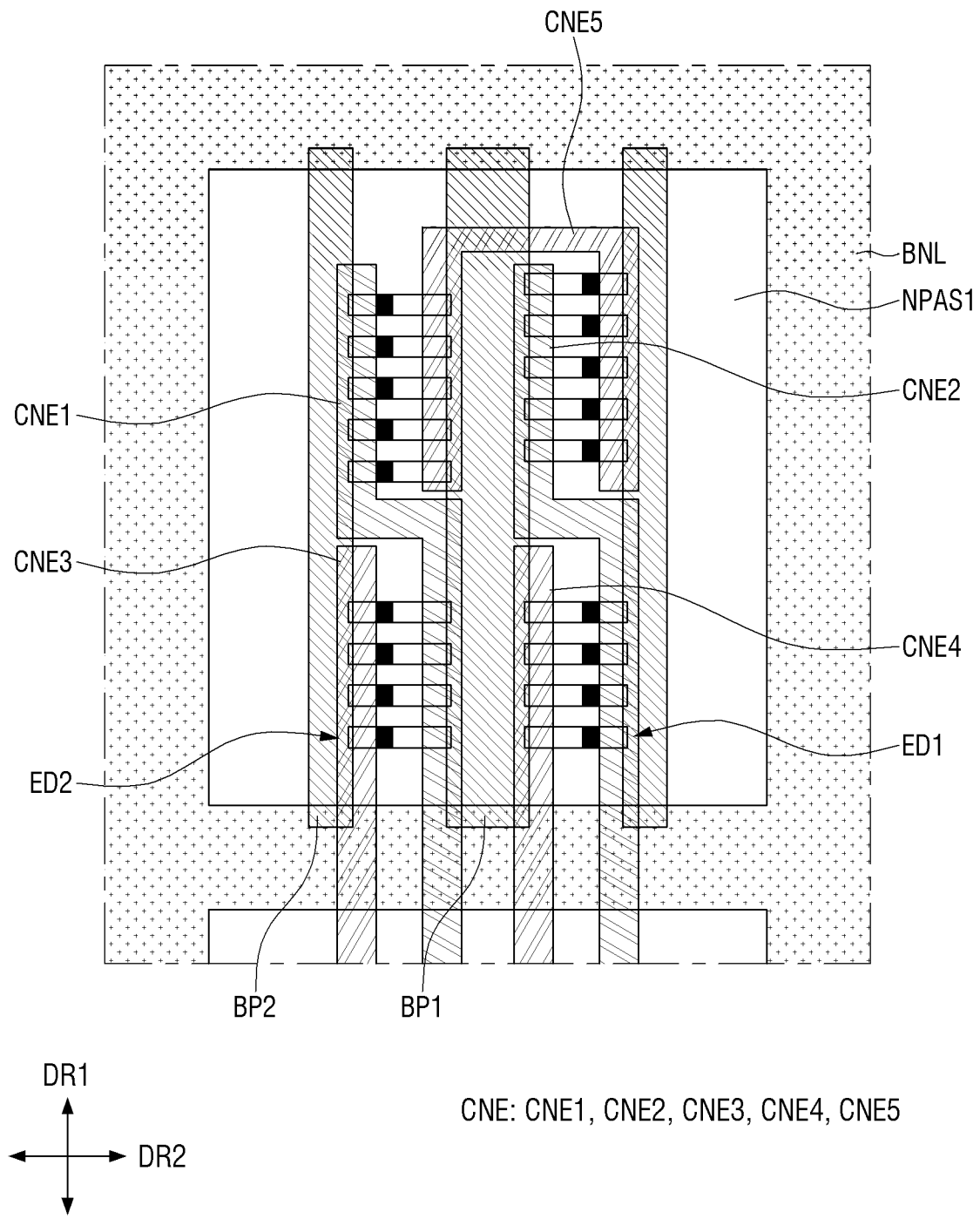
FIG. 8 is a schematic plan view illustrating arrangement of connection electrodes, a bank layer, and light emitting elements, which are disposed in a subpixel of FIG. 5.

FIG. 5 is a schematic plan view illustrating a subpixel of a display device according to an embodiment of the disclosure. FIG. 6 is a schematic plan view illustrating arrangement of electrodes and a bank layer, which are disposed in a subpixel of FIG. 5. FIG. 7 is a schematic plan view illustrating arrangement of connection electrodes and a bank layer, which are disposed in a subpixel of FIG. 5. FIG. 8 is a schematic plan view illustrating arrangement of connection electrodes, a bank layer, and light emitting elements, which are disposed in a subpixel of FIG. 5.

FIG. 5 illustrates a planar arrangement of electrodes RME (e.g., first and second electrodes RME1 and RME2), a bank layer BNL, light emitting elements ED (e.g., first and second light emitting elements ED1 and ED2), connection electrodes CNE (e.g., first to fifth connection electrodes CNE1, CNE2, CNE3, CNE4, and CNE5), and a second insulating layer NPAS1, which are disposed in the subpixel SPXn of the display device 10.

Referring to FIGS. 5 to 8, each of the pixels PX of the display device 10 of FIG. 1 may include multiple subpixels SPXn. For example, each pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be blue, the second color may be green, and the third color may be red, but the disclosure is not limited thereto. The respective subpixels SPXn may emit light of a same color. In an embodiment, the respective subpixels SPXn may emit the blue light. Although one pixel PX is illustrated as including three subpixels SPXn, the disclosure is not limited thereto, and each pixel PX may include a larger number of subpixels SPXn.

Although not shown in the drawings, each subpixel SPXn of the display device 10 may include a light emission area and a non-light emission area. The light emission area of the subpixel SPXn may be an area in which a light emitting element ED emits light of a wavelength band (e.g., a specific or selectable wavelength band). The non-light emission area of the subpixel SPXn may be an area in which the light emitting element ED is not disposed and the light emitted from the light emitting element ED does not reach. Thus, the light may not be emitted from the non-light emission area.

The light emission area of the subpixel SPXn may include an area in which the light emitting element ED is disposed, and an area adjacent to the light emitting element ED in which the light emitted from the light emitting element ED is emitted. For example, the light emission area may also include an area where the light emitted from the light emitting element ED is reflected or refracted by another member. Multiple light emitting elements ED may be disposed in each subpixel SPXn. The light emission area may include an area in which the subpixels SPXn are disposed and an area adjacent to the above area.

The display device 10 according to an embodiment of the disclosure may include electrodes RME (e.g., first and second electrodes RME1 and RME2), bank patterns BP1 and BP2, a bank layer BNL, light emitting elements ED, and connection electrodes CNE (e.g., first to fifth connection electrodes CNE1, CNE2, CNE3, CNE4 and CNE5).

The bank patterns BP1 and BP2 may be disposed in the light emission area of the subpixel SPXn. The bank patterns BP1 and BP2 may have a shape extended in the first direction DR1 with a width (e.g., a predetermined or selectable width) in the second direction DR2.

For example, the bank patterns BP1 and BP2 may include a first bank pattern BP1 and a second bank pattern BP2, which are spaced apart from each other in the second direction DR2 in the light emission area of each subpixel SPXn. The first bank pattern BP1 may be disposed at a center of the light emission area. The second bank patterns BP2 may be spaced apart from each other, and the first bank pattern BP1 may be interposed (or disposed) between adjacent ones of the second bank patterns BP2. The first bank pattern BP1 and the second bank pattern BP2 may be alternately disposed in the second direction DR2, and may be disposed in an island pattern in the display area DPA. The light emitting elements ED may be disposed between the first bank pattern BP1 and the second bank pattern BP2.

Widths of the first bank pattern BP1 and the second bank pattern BP2 in the second direction DR2 may be different from each other. A width of the first bank pattern BP1 in the second direction DR2 may be smaller than that of the second bank pattern BP2 in the second direction DR2. The first bank pattern BP1 may be disposed in the light emission area of the subpixel SPXn, and the second bank pattern BP2 may be disposed over two light emission areas of two subpixels SPXn adjacent to each other in the second direction DR2. The second bank pattern BP2 may be disposed over a boundary of the subpixels SPXn adjacent to each other in the second direction DR2, and may overlap a portion of the bank layer BNL in a plan view, which is extended in the first direction DR1. However, the disclosure is not limited thereto, and the first and second bank patterns BP1 and BP2 may have a same width.

The first bank pattern BP1 and the second bank pattern BP2 may have a same length in the first direction DR1, and may be longer than the length of the light emission area adjacent to (e.g., surrounded by) the bank layer BNL in the first direction DR1. The first bank pattern BP1 and the second bank pattern BP2 may overlap a portion of the bank layer BNL in a plan view, which is extended in the second direction DR2, but are not limited thereto. The bank patterns BP1 and BP2 and the bank layer BNL may be integral with each other. In other embodiment, the bank patterns BP1 and BP2 may partially overlap the portion of the bank layer BNL in a plan view, which is extended in the second direction DR2. A length of the bank patterns BP1 and BP2 in the first direction DR1 may be the same as or greater than a length of the light emission area adjacent to (e.g., surrounded by) the bank layer BNL in the first direction DR1.

Although one first bank pattern BP1 and two second bank patterns BP2 different from each other are illustrated as being disposed for each subpixel SPXn, the disclosure is not limited thereto. The number and shape of the bank patterns BP1 and BP2 may vary depending on the number or arrangement structure of the electrodes RME.

The electrodes RME (e.g., the first and second electrodes RME1 and RME2) may be disposed in each subpixel SPXn in a shape extended in a direction. The electrodes RME1 and RME2 may be extended in the first direction DR1 and disposed in the light emission area of the subpixel SPXn, and the electrodes RME may be spaced apart from each other in the second direction DR2. The electrodes RME may be electrically connected to the light emitting element ED, but are not limited thereto. In other embodiments, the electrodes RME may not be electrically connected to the light emitting element ED.

The display device 10 may include multiple first electrodes RME1 and multiple second electrodes RME2. The multiple second electrodes RME2 may be provided, and the first electrodes RME1 may be disposed between the second electrodes RME2 adjacent to each other. The multiple first electrodes RME1 may be provided, and the second electrode RME2 may be disposed between the first electrodes RME1 adjacent to each other. Hereinafter, in order to distinguish the multiple second electrodes RME2, a second electrode RME2 relatively positioned at a side in the second direction DR2 and a second electrode RME2 relatively positioned at another side in the second direction DR2 are to be distinguished from each other. For example, the another second electrode RME2 of the multiple second electrodes RME2 may be positioned at the another side of the subpixel SPXn in the second direction DR2, and the second electrode RME2 of the multiple second electrodes RME2 may be positioned at the side of the subpixel SPXn in the second direction DR2. In order to distinguish the multiple first electrodes RME1, the first electrode RME1 relatively positioned at a side in the second direction DR2 and the first electrode RME1 relatively positioned at another side in the second direction DR2 are to be distinguished from each other. For example, the another first electrode RME1 of the multiple first electrodes RME1 may be positioned at the another side of the subpixel SPXn in the second direction DR2, and the first electrode RME1 of the multiple first electrodes RME1 may be positioned at the side of the subpixel SPXn in the second direction DR2.

The second electrode RME2 positioned at the another side in the second direction DR2 (e.g., the another side of the subpixel SPXn in the second direction DR2) and the first electrode RME1 positioned at the side in the second direction DR2 (e.g., the side of the subpixel SPXn in the second direction DR2) may overlap the second bank pattern BP2 in a plan view. The second electrode RME2 positioned at the side in the second direction DR2 and the first electrode RME1 positioned at the another side in the second direction DR2 may overlap the first bank pattern BP1 in a plan view.

For example, a high potential voltage (hereinafter, referred to as a first power voltage) may be applied to the second electrode RME2 positioned at the another side in the second direction DR2, and a low potential voltage (hereinafter, referred to as a second power voltage) may be applied to the second electrode RME2 positioned at the side in the second direction DR2, but the disclosure is not limited thereto.

In FIGS. 5 and 6, two first electrodes RME1 and two second electrodes RME2 may be disposed in each of the subpixels SPXn, but are not limited thereto. For example, in the display device 10, a larger number of electrodes RME may be disposed in each subpixel SPXn, or the arrangement and shape of the electrodes RME may be variously changed.

The bank layer BNL may be adjacent to (or surround) the subpixel SPXn. The bank layer BNL may have a planar lattice shape and be adjacent to (or surround) the subpixel SPXn.

The bank layer BNL may include a portion extended in the first direction DR1 and the second direction DR2 in a plan view, and may be disposed on the front surface of the display area DPA in a lattice pattern. The bank layer BNL may be disposed over a boundary of the subpixels SPXn and partition (or separate) the subpixels SPXn adjacent to each other.

The light emitting elements ED may be disposed in the light emission area. The light emitting elements ED may be disposed between the bank patterns BP1 and BP2, and may be spaced apart from each other in the first direction DR1. In an embodiment, the light emitting element ED may have a shape extended in a direction, and ends (e.g., both ends) thereof may be disposed on the different electrodes RME. The light emitting element ED may be longer than an interval between the electrodes RME spaced apart from each other in the second direction DR2. The light emitting elements ED may be extended and perpendicular to the first direction DR1 in which the electrodes RME are extended.

However, the disclosure is not limited thereto, and the light emitting elements ED may be extended toward the second direction DR2 or a direction inclined with respect to the second direction DR2.

The light emitting element ED may include a first light emitting element ED1 and a second light emitting element ED2. The first light emitting element ED1 may have ends (e.g., both ends) disposed on the first electrode RME1 and one of the second electrodes RME2. The second light emitting element ED2 may have ends (e.g., both ends) disposed on the another first electrode RME1 and the another of the second electrodes RME2. The second light emitting element ED2 may be disposed between the another second electrode RME2 at the another side in the second direction DR2 and the another first electrode RME1 at the another side in the second direction. The first light emitting element ED1 may be disposed between the second electrode RME2 at the side in the second direction DR2 and the first electrode RME1 at the side in the second direction DR2.

The connection electrodes CNE (e.g., the first to fifth connection electrodes CNE1, CNE2, CNE3, CNE4 and CNE5) may be disposed on the electrodes RME and the bank patterns BP1 and BP2. The connection electrodes CNE may be in contact with the light emitting element ED, and may be electrically connected to the electrodes RME or a conductive layer below the electrodes RME.

The connection electrodes CNE may include a first connection electrode CNE1, a second connection electrode CNE2, a third connection electrode CNE3, a fourth connection electrode CNE4, and a fifth connection electrode CNE5, which are disposed in the subpixel SPXn.

The first connection electrode CNE1 may include a (1-1)th electrode portion (or 1-1-th electrode portion), a (1-2)th electrode portion (or 1-2-th electrode portion), and a (1-3)th electrode portion (or 1-3-th electrode portion). The (1-1)th electrode portion and the (1-2)th electrode portion may be extended in the first direction DR1. The (1-3)th electrode portion may electrically connect the (1-1)th electrode portion with the (1-2)th electrode portion.

The (1-1)th electrode portion may overlap an upper end of the second electrode RME2 at the another side in the second direction DR2, and the (1-2)th electrode portion may overlap a lower end of the first electrode RME1 at the another side in the second direction DR2.

The second connection electrode CNE2 may include a (2-1)th electrode portion (or 2-1-th electrode portion), a (2-2)th electrode portion (or 2-2-th electrode portion), and a (2-3)th electrode portion (or 2-3-th electrode portion). The (2-1)th electrode portion and the (2-2)th electrode portion may be extended in the first direction DR1. The (2-3)th electrode portion may electrically connect the (2-1)th electrode portion with the (2-2)th electrode portion.

The (2-1)th electrode portion may overlap an upper end of the second electrode RME2 at the side in the second direction DR2 in a plan view, and the second electrode portion may overlap a lower end of the first electrode RME1 at the side in the second direction DR2 in a plan view.

The third connection electrode CNE3 may be spaced apart from the fourth connection electrode CNE4, and the (1-2)th electrode portion may be interposed (or disposed) between the third connection electrode CNE3 and the fourth connection electrode CNE4. The third connection electrode CNE3 and the fourth connection electrode CNE4 may be extended in the first direction DR1, respectively. The third connection electrode CNE3 may be positioned at another side of the (1-2)th electrode portion in the second direction DR2, and the fourth connection electrode CNE4 may be positioned at a side of the (1-2)th electrode portion in the second direction DR2. The third connection electrode CNE3 may be positioned on the same line with the (1-1)th electrode portion in the first direction DR1, but is not limited thereto. The fourth connection electrode CNE4 may be positioned on the same line with the (2-1)th electrode portion in the first direction DR1, but is not limited thereto.

The fifth connection electrode CNE5 may include a (5-1)th electrode portion (or 5-1-th electrode portion), a (5-2)th electrode portion (or 5-2-th electrode portion), and a (5-3)th electrode portion (or 5-3-th electrode portion). The (5-1)th electrode portion and the (5-2)th electrode portion may be extended in the first direction DR1. The (5-3)th electrode portion may be extended in the second direction DR2 and electrically connect the (5-1)th electrode portion with the (5-2)th electrode portion. The (5-1)th electrode portion may be disposed between the (1-1)th electrode portion and the (2-1)th electrode portion, and the (5-2)th electrode portion may be disposed on the side of the (2-1)th electrode portion in the second direction DR2. The (5-1)th electrode portion may be positioned on the same line with the (1-2)th electrode portion in the first direction DR1, but is not limited thereto. The (5-2)th electrode portion may be positioned on the same line with the (2-2)th electrode portion in the first direction DR1, but is not limited thereto.

The (1-2)th electrode portion of the first connection electrode CNE1 may be electrically connected to the first electrode RME1 at the another side in the second direction DR2, the (2-2)th electrode portion of the second connection electrode CNE2 may be electrically connected to the first electrode RME1 at the side in the second direction DR2, the third connection electrode CNE3 may be electrically connected to the second electrode RME2 at the another side in the second direction DR2, and the fourth connection electrode CNE4 may be electrically connected to the second electrode RME2 at the side in the second direction DR2, but the disclosure is not limited thereto.

An end of the first light emitting elements ED1 positioned at one side in the first direction DR1 (e.g., the side of the subpixel SPXn in the first direction DR1) rather than the (2-2)th electrode portion in a plan view may be in contact with the (5-2)th electrode portion of the fifth connection electrode CNE5. For example, the end of the first light emitting elements ED1 may be positioned closer at the side of the subpixel SPXn in the first direction DR1 than the (2-2)th electrode portion in a plan view. Another end of the first light emitting elements ED1 positioned at the side in the first direction DR1 rather than the (2-2)th electrode portion in a plan view may be in contact with the (2-1)th electrode portion of the second connection electrode CNE2. For example, the another end of the first light emitting elements ED1 positioned closer at the side of the subpixel SPXn in the first direction DR1 than the (2-2)th electrode portion in a plan view. An end of the first light emitting elements ED1 positioned at another side in the first direction DR1 (e.g., the another side of the subpixel SPXn in the first direction DR1) rather than the (2-2)th electrode portion in a plan view may be in contact with the (2-2)th electrode portion of the second connection electrode CNE2. For example, the end of the first light emitting elements ED1 may be positioned closer at the another side of the subpixel SPXn in the first direction DR1 than the (2-2)th electrode portion in a plan view. The another end of the first light emitting elements ED1 positioned at the another side in the first direction DR1 rather than the (2-2)th electrode portion in a plan view may be in contact with the fourth connection electrode CNE4. For example, the another end of the first light emitting elements ED1 may be positioned closer at the another side of the subpixel SPXn in the first direction DR1 than the (2-2)th electrode portion in a plan view.

An end of the second light emitting elements ED2 positioned at a side in the first direction DR1 rather than the (1-2)th electrode portion in a plan view may be in contact with the (1-1)th electrode portion of the first connection electrode CNE1. For example, the end of the second light emitting elements ED2 may be positioned closer at the side of the subpixel SPXn in the first direction DR1 than the (1-2)th electrode portion in a plan view. The another end of the second light emitting elements ED2 positioned at the side in the first direction DR1 rather than the (1-2)th electrode portion in a plan view may be in contact with the (5-1)th electrode portion of the fifth connection electrode CNE5. For example, the another end of the second light emitting elements ED2 may be positioned closer at the side of the subpixel SPXn in the first direction DR1 than the (1-2)th electrode portion in a plan view. The end of the second light emitting elements ED2 positioned at the another side in the first direction DR1 rather than the (1-2)th electrode portion in a plan view may be in contact with the third connection electrode CNE3. For example, the end of the second light emitting elements ED2 may be positioned closer at the another side of the subpixel SPXn in the first direction DR1 than the (1-2)th electrode portion in a plan view. The another end of the second light emitting elements ED2 positioned at the another side in the first direction DR1 rather than the (1-2)th electrode portion in a plan view may be in contact with the (1-2)th electrode portion of the first connection electrode CNE1. For example, the another end of the second light emitting elements ED2 may be positioned closer at the another side of the subpixel SPXn in the first direction DR1 than the (1-2)th electrode portion in a plan view.

As described below in FIG. 9, the display device 10 may further include insulating layers RMPS, NPAS1, and NPAS2 disposed between the electrodes RME1 and RME2, the light emitting elements ED, and the connection electrodes CNE1, CNE2, CNE3, CNE4 and CNE5. The electrodes RME1 and RME2, the light emitting elements ED, and the connection electrodes CNE1, CNE2, CNE3, CNE4 and CNE5 may overlap one another in a plan view, but only a portion thereof may be in contact with each other by the insulating layers RMPS, NPAS1 and NPAS2 disposed therebetween.

The second insulating layer NPAS1 of the insulating layers RMPS, NPAS1, and NPAS2 is only shown in FIG. 5.

The second insulating layer NPAS1 may include multiple open portions. The open portions may include a first open portion OP1, a second open portion OP2, a third open portion OP3, a fourth open portion OP4, a tenth open portion OP10, an eleventh open portion OP11, a twelfth open portion OP12, and a thirteenth open portion OP13 extended in the first direction DR1, and may include a fifth open portion OP5, a sixth open portion OP6, a seventh open portion OP7, an eighth open portion OP8, and a ninth open portion OP9 extended in the second direction DR2. The first open portion OP1 and the tenth open portion OP10 may be positioned on a substantially same line in the first direction DR1. The second open portion OP2 and the twelfth open portion OP12 may be positioned on a substantially same line in the first direction DR1. The third open portion OP3 and the eleventh open portion OP11 may be positioned on a substantially same line in the first direction DR1. The fourth open portion OP4 and the thirteenth open portion OP13 may be positioned on a substantially same line in the first direction DR1.

The fifth open portion OP5 may be positioned between the third open portion OP3 and the eleventh open portion OP11 and between the tenth open portion OP10 and the first open portion OP1 in a plan view. The fifth open portion OP5 may connect the third open portion OP3 with the tenth open portion OP10 in a plan view. The fifth open portion OP5 may connect the eleventh open portion OP11 with the first open portion OP1 in a plan view.

The sixth open portion OP6 may be positioned between the fourth open portion OP4 and the thirteenth open portion OP13 and between the twelfth open portion OP12 and the eighth open portion OP8 in a plan view. The sixth open portion OP6 may connect the fourth open portion OP4 with the twelfth open portion OP12 in a plan view. The sixth open portion OP6 may connect the thirteenth open portion OP14 with the eighth open portion OP8 in a plan view.

The seventh open portion OP7 may connect the eleventh open portion OP11 with the first open portion OP1 in a plan view. The eighth open portion OP8 may connect the thirteenth open portion OP13 with the eighth open portion OP8 in a plan view.

The ninth open portion OP9 may connect the tenth open portion OP10, the fourth open portion OP4, and the twelfth open portion OP12 with one another in a plan view.

Each of the third open portion OP3, the fifth open portion OP5, and the eleventh open portion OP11 may overlap the second electrode RME2 at the another side in the second direction DR2. Each of the tenth open portion OP10, the fifth open portion OP5, and the first open portion OP1 may overlap the first electrode RME1 at the another side in the second direction DR2. Each of the fourth open portion OP4, the sixth open portion OP6, and the thirteenth open portion OP13 may overlap the second electrode RME2 at the side in the second direction DR2. Each of the twelfth open portion OP12, the sixth open portion OP6, and the second open portion OP2 may overlap the first electrode RME1 at the side in the second direction DR2.

The seventh open portion OP7 may overlap the second electrode RME2 at the another side in the second direction DR2 and the first electrode RME1 at the another side in the second direction DR2. The eighth open portion OP8 may overlap the second electrode RME2 at the side in the second direction DR2 and the first electrode RME1 at the side in the second direction DR2.

The ninth open portion OP9 may overlap the second electrode RME2 at the another side in the second direction DR2, the first electrode RME1 at the another side in the second direction DR2, and the second electrode RME2 at the side in the second direction DR2.

The third open portion OP3 may overlap the (1-1)th electrode portion of the first connection electrode CNE1 in a plan view. The fifth open portion OP5 may overlap the (1-3)th electrode portion of the first connection electrode CNE1 in a plan view. The first open portion OP1 may overlap the (1-2)th electrode portion of the first connection electrode CNE1 in a plan view. The fourth open portion OP4 may overlap the (2-1)th electrode portion of the second connection electrode CNE2 in a plan view. The sixth open portion OP6 may overlap the (2-3)th electrode portion of the second connection electrode CNE2 in a plan view. The second open portion OP2 may overlap the (2-2)th electrode portion of the second connection electrode CNE2 in a plan view.

The eleventh open portion OP11 may overlap the third connection electrode CNE3 in a plan view. The thirteenth open portion OP13 may overlap the fourth connection electrode CNE4 in a plan view. The tenth open portion OP10 may overlap the (5-1)th electrode portion of the fifth connection electrode CNE5 in a plan view. The twelfth open portion OP12 may overlap the (5-2)th electrode portion of the fifth connection electrode CNE5 in a plan view. The ninth open portion OP9 may overlap the (5-3)th electrode portion of the fifth connection electrode CNE5 in a plan view.

The third open portion OP3 may expose the end of the second light emitting element ED2 and electrically connect the (1-1)th electrode portion of the first connection electrode CNE1 thereabove to the end of the second light emitting element ED2. The first open portion OP1 may expose the another end of the second light emitting element ED2 and electrically connect the (1-2)th electrode portion of the first connection electrode CNE1 thereabove to the another end of the second light emitting element ED2. The fourth open portion OP4 may expose the another end of the first light emitting element ED1 and electrically connect the (2-1)th electrode portion of the second connection electrode CNE2 thereabove to the another end of the first light emitting element ED1. The second open portion OP2 may expose the end of the first light emitting element ED1 and electrically connect the (2-2)th electrode portion of the second connection electrode CNE2 thereabove to the end of the first light emitting element ED1.

The tenth open portion OP10 may expose the another end of the second light emitting element ED2 and electrically connect the (5-1)th electrode portion of the fifth connection electrode CNE5 thereabove to the another end of the second light emitting element ED2. The twelfth open portion OP12 may expose the end of the first light emitting element ED1 and electrically connect an end of the (5-2)th electrode portion of the fifth connection electrode CNE5 thereabove to the end of the first light emitting element ED1.

The eleventh open portion OP11 may expose the end of the second light emitting element ED2 and electrically connect the third connection electrode CNE3 thereabove to the end of the second light emitting element ED2. The thirteenth open portion OP13 may expose the another end of the first light emitting element ED1 and electrically connect the fourth connection electrode CNE4 thereabove to the another end of the first light emitting element ED1.

Figure 9:
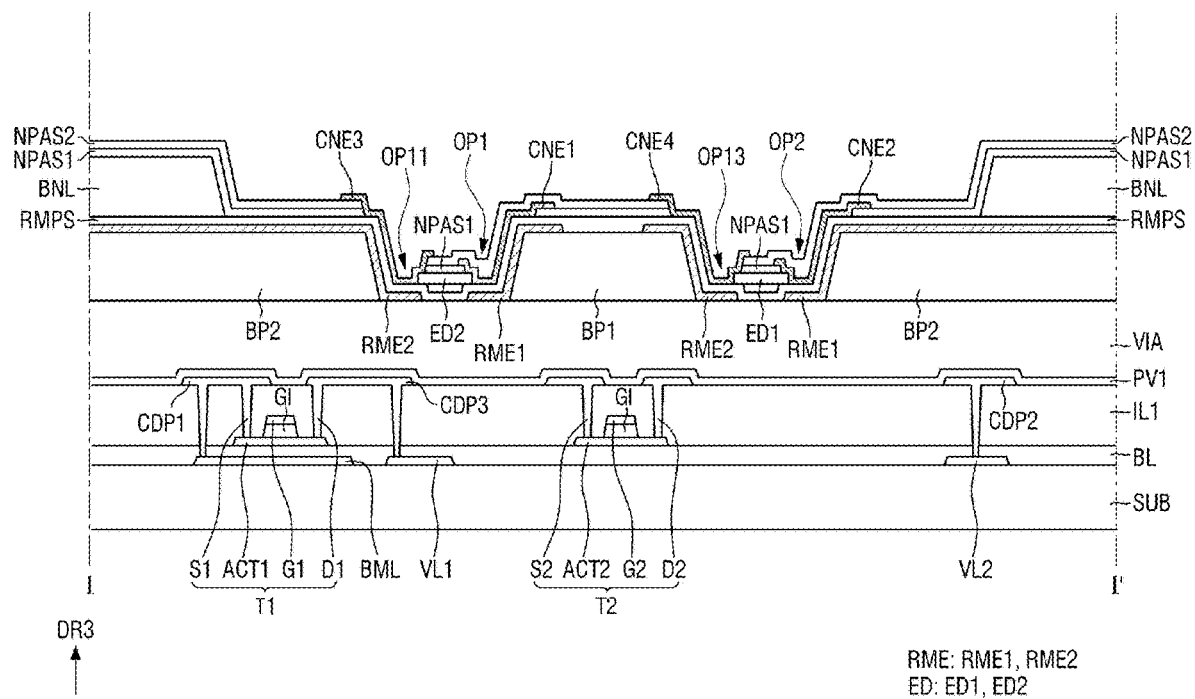
FIG. 9 is a schematic cross-sectional view taken along line I-I' of FIG. 5.

FIG. 9 is a schematic cross-sectional view taken along line I-I' of FIG. 5.

Detailed description of a sectional structure of the display device 10 is provided with reference to FIGS. 5 to 9. The display device 10 may include a first substrate SUB, a semiconductor layer, conductive layers and insulating layers. The semiconductor layer, the conductive layers, and the insulating layers may be disposed on the first substrate SUB. The display device 10 may include the electrodes RME (e.g., the first and second electrodes RME1 and RME2), the light emitting elements ED (e.g., the first and second light emitting elements ED1 and ED2), and the connection electrodes CNE (e.g., the first to fifth connection electrodes CNE1, CNE2, CNE3, CNE4, and CNE5). The semiconductor layer, the conductive layers, and the insulating layers may constitute a circuit layer of the display device 10, respectively.

The first substrate SUB may be an insulating substrate. The first substrate SUB may be made of an insulating material such as glass, quartz, or a polymer resin. However, the embodiments are not limited thereto. The first substrate SUB may be a rigid substrate, but may be a flexible substrate capable of bending, folding, rolling, or the like. The first substrate SUB may include a display area DPA and a non-display area NDA adjacent to (e.g., surrounding) the display area DPA, and the display area DPA may include a light emission area and a non-light emission area.

The first conductive layer may be disposed on the first substrate SUB. The first conductive layer may include a lower metal layer BML, a first voltage line VL1, and a second voltage line VL2. The lower metal layer BML may overlap a first active layer ACT1 of the first transistor T1 in a plan view. The lower metal layer BML may prevent light from being incident on the first active layer ACT1 of the first transistor T1. In an embodiment, the lower metal layer BML may be electrically connected to the first active layer ACT1 and stabilize electrical characteristics of the first transistor T1. However, the lower metal layer BML may be omitted.

The high potential voltage (or first power voltage) transferred to the first electrode RME1 may be applied to the first voltage line VL1, and the low potential voltage (or second power voltage) transferred to the second electrode RME2 may be applied to the second voltage line VL2. The first voltage line VL1 may be electrically connected to the first transistor T1 through a conductive pattern (e.g., third conductive pattern CDP3) of the third conductive layer. The second voltage line VL2 may be electrically connected to the second electrode RME2 through a conductive pattern (e.g., second conductive pattern CDP2) of the third conductive layer.

The first voltage line VL1 and the second voltage line VL2 are illustrated as being disposed in the first conductive layer, but are not limited thereto. In some embodiments, the first voltage line VL1 and the second voltage line VL2 may be disposed in the third conductive layer, and may be directly and electrically connected to the first transistor T1 and the second electrode RME2, respectively.

A buffer layer BL may be disposed on the first conductive layer and the first substrate SUB. The buffer layer BL may be formed on the first substrate SUB and protect the transistors of the pixel PX from water (or moisture) permeated through the first substrate SUB, which is vulnerable to moisture permeation, and may planarize a surface of the first substrate SUB, on which the lines (e.g., the first and second voltage lines V1 and V2 and the lower metal layer BML, or the like).

The semiconductor layer may be disposed on the buffer layer BL. The semiconductor layer may include the first active layer ACT1 of the first transistor T1 and a second active layer ACT2 of the second transistor T2. The first transistor T1 may include the first active layer ACT1, a first gate electrode G1, a first source electrode S1, and a first drain electrode D1. The second transistor T2 may include the second active layer ACT2, a second gate electrode G2, a second source electrode S2, and a second drain electrode D2. The first and second active layers ACT1 and ACT2 may partially overlap the first gate electrode G1 and the second gate electrode G2 of the second conductive layer in a plan view, which will be described later.

The semiconductor layer may include at least one of polycrystalline silicon, monocrystalline silicon, and an oxide semiconductor. However, the disclosure is not limited thereto. In another embodiment, the semiconductor layer may include polycrystalline silicon. The oxide semiconductor may be an oxide semiconductor containing indium (In). For example, the oxide semiconductor of the semiconductor layer may include at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO). However, the embodiments are not limited thereto.

Each first transistor T1 may be disposed in the subpixel SPXn of the display device 10, but the disclosure is not limited thereto, and the display device 10 may include a larger number of first transistors T1.

A first gate insulating layer GI may be disposed on the semiconductor layer in the display area DPA. The first gate insulating layer GI may serve as a gate insulating layer of each of the transistors T1 and T2. The first gate insulating layer GI may be patterned together with the gate electrodes G1 and G2 of the second conductive layer, and partially disposed between the second conductive layer and the active layers ACT1 and ACT2 of the semiconductor layer, but is not limited thereto. Detailed description thereof is provided below. In some embodiments, the first gate insulating layer GI may be disposed on (e.g., disposed entirely on) the buffer layer BL.

The second conductive layer may be disposed on the first gate insulating layer GI. The second conductive layer may include the first gate electrode G1 of the first transistor T1 and the second gate electrode G2 of the second transistor T2. The first gate electrode G1 may overlap a channel area of the first active layer ACT1 in a third direction DR3 that is a thickness direction, and the second gate electrode G2 may overlap a channel area of the second active layer ACT2 in the third direction DR3 that is a thickness direction. Although not shown in the drawings, the second conductive layer may further include an electrode of the storage capacitor Cst (e.g., refer to FIGS. 3 and 4).

A first interlayer insulating layer IL1 may be disposed on the second conductive layer. The first interlayer insulating layer IL1 may serve as an insulating layer between the second conductive layer and other layers disposed on the second conductive layer, and may protect the second conductive layer.

The third conductive layer may be disposed on the first interlayer insulating layer IL1. The third conductive layer may include conductive patterns CDP1, CDP2 and CDP3, the first source electrode S1, the second source electrode S2, the first drain electrode D1, and the second drain electrode D2 of the transistors T1 and T2. Some of the conductive patterns CDP1, CDP2 and CDP3 may electrically connect conductive layers or semiconductor layers of different layers to each other and serve as source/drain electrodes of the transistors T1 and T2.

The first conductive pattern CDP1 may be in contact with the first active layer ACT1 of the first transistor T1 through a contact hole that passes through the first interlayer insulating layer IL1. The first conductive pattern CDP1 may be in contact with the lower metal layer BML through a contact hole that passes through the first interlayer insulating layer IL1 and the buffer layer BL. The first conductive pattern CDP1 may serve as the first source electrode S1 of the first transistor T1. The first conductive pattern CDP1 may be electrically connected to the second electrode RME2 at the another side in the second direction DR2.

The first transistor T1 may transfer the first power voltage applied from the first voltage line VL1 to the second electrode RME2 at the another side in the second direction DR2 (e.g., the another side of the subpixel SPXn of FIG. 5 in the second direction DR2).

The second conductive pattern CDP2 may be in contact with the second voltage line VL2 through a contact hole that passes through the first interlayer insulating layer IL1 and the buffer layer BL. The second conductive pattern CDP2 may be electrically connected to the second electrode RME2 at the another side in the second direction DR2. The second voltage line VL2 may transfer the second power voltage to the second electrode RME2 at the another side in the second direction DR2.

The third conductive pattern CDP3 may be in contact with the first voltage line VL1 through a contact hole that passes through the first interlayer insulating layer IL1 and the buffer layer BL. The third conductive pattern CDP3 may be in contact with the first active layer ACT1 of the first transistor T1 through a contact hole that passes through the first interlayer insulating layer IL1. The third conductive pattern CDP3 may electrically connect the first voltage line VL1 to the first transistor T1, and may serve as the first drain electrode D1 of the first transistor T1.

Each of the second source electrode S2 and the second drain electrode D2 may be in contact with the second active layer ACT2 of the second transistor T2 through the contact hole that passes through the first interlayer insulating layer IL1. The second transistor T2 may transfer a data signal to the first transistor T1, or may transfer an initialization signal to the first transistor T1.

A first passivation layer PV1 may be disposed on the third conductive layer. The first passivation layer PV1 may serve as an insulating layer between the third conductive layer and other layers, and may protect the third conductive layer.

The buffer layer BL, the first gate insulating layer GI, the first interlayer insulating layer ILL and the first passivation layer PV1 may be formed of inorganic layers that are alternately stacked each other. For example, each of the buffer layer BL, the first gate insulating layer GI, the first interlayer insulating layer ILL and the first passivation layer PV1 may be formed of a double layer in which inorganic layers including at least one of silicon oxide ($SiO_x$), silicon nitride ($SiN_x$), and silicon oxynitride ($SiO_xN_y$) are stacked each other, or multiple layers in which the inorganic layers are alternately stacked each other, but are not limited thereto. The buffer layer BL, the first gate insulating layer GI, the first interlayer insulating layer ILL and the first passivation layer PV1 may be made of at least one inorganic layer including the insulating material described above. Also, in some embodiments, the first interlayer insulating layer IL1 may be made of an organic insulating material such as polyimide (PI).

A via layer VIA may be disposed on the third conductive layer in the display area DPA. The via layer VIA may include an organic insulating material such as, for example, polyimide (PI), to compensate for (or planarize) a step difference (or height or thickness difference) caused by the lower conductive layers and form a flat upper surface. However, in some embodiments, the via layer VIA may be omitted.

The display device 10 may include bank patterns BP1 and BP2, electrodes RME (e.g., the first and second electrodes RME1 and RME2), a bank layer BNL, light emitting elements ED, and connection electrodes CNE (e.g., the first to fifth connection electrodes CNE1, CNE2, CNE3, CNE4 and CNE5) as display element layers disposed on the via layer VIA. The display device 10 may include insulating layers RMPS, NPAS2 and NPAS2 disposed on the via layer VIA.

The bank patterns BP1 and BP2 may be disposed on the via layer VIA. For example, the bank patterns BP1 and BP2 may be disposed on (e.g., disposed directly on) the via layer VIA, and at least a portion of the bank patterns BP1 and BP2 may have a protruded structure based on the upper surface of the via layer VIA. The protruded portions of the bank patterns BP1 and BP2 may have sides inclined or bent with a curvature (e.g., a predetermined or selectable curvature), and light emitted from the light emitting element ED may be reflected by the electrodes RME disposed on the bank patterns BP1 and BP2 and emitted in an upper direction (e.g., in the first direction DR3) of the via layer VIA. Unlike the shown example, outer surfaces of the bank patterns BP1 and BP2 on a cross-sectional view may have a shape curved with a curvature (e.g., a predetermined or selectable curvature), for example, a semi-circular or semi-elliptical shape. The bank patterns BP1 and BP2 may include, but are not limited to, an organic insulating material such as polyimide (PI).

The electrodes RME (e.g., the first and second electrodes RME1 and RME2) may be disposed on the bank patterns BP1 and BP2 and the via layer VIA. The first electrode RME1 and the second electrode RME2 may be disposed on the inclined sides of the bank patterns BP1 and BP2.

The light emitting elements ED disposed between the bank patterns BP1 and BP2 may emit light in both end directions thereof, and the emitted light may be directed to the electrodes RME disposed on the bank patterns BP1 and BP2. A portion of each electrode RME, which is disposed on the bank patterns BP1 and BP2, may reflect light emitted from the light emitting element ED. The first electrode RME1 and the second electrode RME2 may cover at least one side of the bank patterns BP1 and BP2 and reflect the light emitted from the light emitting element ED.

The electrodes RME may include a conductive material having high reflectance. For example, the electrodes RME may include a metal such as silver (Ag), copper (Cu) and aluminum (Al) or an alloy containing aluminum (Al), nickel (Ni), lanthanum (La), etc., or may have a structure in which a metal layer such as titanium (Ti), molybdenum (Mo) and niobium (Nb) and/or an alloy thereof are stacked each other. In some embodiments, the electrodes RME may be a double layer or multiple layers in which an alloy containing aluminum (Al) and at least one metal layer of titanium (Ti), molybdenum (Mo) or niobium (Nb) are stacked each other.

The disclosure is not limited thereto, and each of the electrodes RME may further include a transparent conductive material. For example, each electrode RME may include a material including at least one of ITO, IZO, and ITZO. In some embodiments, each of the electrodes RME may have a structure in which one or more layers of a transparent conductive material and a metal layer having high reflectance are stacked each other. In other embodiments, each of the electrodes RME may be formed as a single layer including the transparent conductive material and the metal layer. For example, each electrode RME may have a stacked structure such as ITO/Ag/ITO/, ITO/Ag/IZO or ITO/Ag/ITZO/IZO. The electrodes RME may be electrically connected to the light emitting elements ED, and may reflect some of the light emitted from the light emitting elements ED in an upper direction (e.g., the third direction DR3) of the first substrate SUB.

The first insulating layer RMPS may be disposed on the via layer VIA and the electrodes RME. The first insulating layer RMPS may include an insulating material and protect the electrodes RME. For example, the first insulating layer RMPS may electrically insulate the different electrodes RME from each other. The first insulating layer RMPS may cover the electrodes RME before the bank layer BNL is formed, thereby preventing the electrodes RME from being damaged in the process of forming the bank layer BNL. The first insulating layer RMPS may prevent the light emitting element ED disposed thereon from being damaged due to direct contact with other members.

The bank layer BNL may be disposed on the first insulating layer RMPS. The bank layer BNL may include a portion extended in the first direction DR1 and the second direction DR2, and may be adjacent to (e.g., surround) each of the subpixels SPXn.

The bank layer BNL may have a height (e.g., a predetermined or selectable height) similar to the bank patterns BP1 and BP2. In some embodiments, an upper surface of the bank layer BNL may be higher than upper surfaces of the bank patterns BP1 and BP2. A thickness of the bank layer BNL may be equal to or greater than that of the bank patterns BP1 and BP2. The bank layer BNL may prevent ink from overflowing to an adjacent subpixel SPXn adjacent thereto in an inkjet printing process of a manufacturing process of the display device 10. The bank layer BNL may include an organic insulating material such as polyimide in the same manner as the bank patterns BP1 and BP2.

The light emitting elements ED may be disposed in the light emission area. The light emitting elements ED may be disposed on the first insulating layer RMPS between the bank patterns BP1 and BP2. The light emitting element ED2 may be disposed such that a portion extended in a direction is to be parallel to the upper surface of the first substrate SUB. As described below, the light emitting elements ED may include semiconductor layers disposed in the extended direction, and the semiconductor layers may be sequentially disposed in a direction parallel to the upper surface of the first substrate SUB, but the disclosure is not limited thereto. When the light emitting element ED has another structure, the semiconductor layers may be disposed in a direction perpendicular to the first substrate SUB.

The light emitting elements ED disposed in the respective subpixels SPXn may emit lights having different wavelength bands depending on the material of the semiconductor layer, but are not limited thereto. The light emitting elements ED disposed in the respective subpixels SPXn may include semiconductor layers of a same material and emit light of a same color.

The light emitting elements ED may be disposed on different electrodes RME between different bank patterns BP1 and BP2.

The light emitting elements ED may be in contact with the connection electrodes CNE (e.g., the first to fifth connection electrodes CNE1, CNE2, CNE3, CNE4 and CNE5), and may be electrically connected to the conductive layers below the electrodes RME and the via layer VIA. The light emitting elements ED may emit light of a wavelength band (e.g., a specific wavelength band) as an electrical signal is applied thereto.

The second insulating layer NPAS1 may be disposed on the light emitting elements ED, the first insulating layer RMPS, and the bank layer BNL. The second insulating layer NPAS1 may include the first, second, third, fourth, tenth, eleventh, twelfth, and thirteenth open portions OP1, OP2, OP3, OP4, OP10, OP11, OP12, and OP13 extended in the first direction DR1 between the bank patterns BP1 and BP2 and disposed on the light emitting elements ED. The first, second, third, fourth, tenth, eleventh, twelfth, and thirteenth open portions OP1, OP2, OP3, OP4, OP10, OP11, OP12 and OP13 may be adjacent to (e.g., partially surround) an outer surface of the light emitting element ED, and may not cover both sides or both ends of the light emitting element ED. The first, second, third, fourth, tenth, eleventh, twelfth, and thirteenth open portions OP1, OP2, OP3, OP4, OP10, OP11, OP12 and OP13 may form a linear or island shaped pattern within each subpixel SPXn on a plan view. The first, second, third, fourth, tenth, eleventh, twelfth, and thirteenth open portions OP1, OP2, OP3, OP4, OP10, OP11, OP12 and OP13 of the second insulating layer NPAS1 may protect the light emitting elements ED and fix the light emitting elements ED in the manufacturing process of the display device 10.

When the first and second connection electrodes CNE1 and CNE2 are formed through the fifth, sixth, seventh, eighth, and ninth open portions OP5, OP6, OP7, OP8, and OP9 of the second insulating layer NPAS1, a large amount of the light emitting elements ED agglomerated on the fifth, sixth, seventh, eighth, and ninth open portions OP5, OP6, OP7, OP8 and OP9 or particles may be removed.

The first and second connection electrodes CNE1 and CNE2 may be disposed on the second insulating layer NPAS1. The first connection electrode CNE1 may overlap the first electrode RME1 at the another side in the second direction DR2, and the second connection electrode CNE2 may overlap the first electrode RME1 at the side in the second direction DR2 (e.g., the side of the subpixel SPXn of FIG. 5 in the second direction DR2). Each of the first and second connection electrodes CNE1 and CNE2 may be in contact with an end of the second light emitting element ED2 through the first open portion OP1 of the second insulating layer NPAS1, and may be in contact with an end of the first light emitting element ED1 through the second open portion OP2. The connection electrodes CNE may include a conductive material. For example, the connection electrodes CNE may include at least one of ITO, IZO, ITZO, Al, etc. However, the disclosure is not limited thereto. For example, the connection electrode CNE may include a transparent conductive material, and light emitted from the light emitting element ED may be emitted by transmitting the connection electrode CNE.

The third insulating layer NPAS2 may be disposed on the connection electrodes CNE1 and CNE2. The third insulating layer NPAS2 may be disposed on (e.g., disposed entirely on) the second insulating layer NPAS1 and cover the first and second connection electrodes CNE1 and CNE2. The third to fifth connection electrodes CNE3, CNE4 and CNE5 may be disposed on the third insulating layer NPAS2. The third insulating layer NPAS2 may electrically insulate the first connection electrode CNE1 and the second connection electrode CNE2 from the third to fifth connection electrodes CNE3, CNE4 and CNE5. Thus, the first connection electrode CNE1 and the second connection electrode CNE2 may not be directly in contact with the third to fifth connection electrodes CNE3, CNE4 and CNE5.

Each of the first insulating layer RMPS, the second insulating layer NPAS1, and the third insulating layer NPAS2 may include an inorganic insulating material or an organic insulating material. For example, each of the first insulating layer RMPS, the second insulating layer NPAS1, and the third insulating layer NPAS2 may include an inorganic insulating material. In other embodiments, the first insulating layer RMPS and the third insulating layer NPAS2 may include an inorganic insulating material, and the second insulating layer NPAS1 may include an organic insulating material. Each or at least one of the first insulating layer RMPS, the second insulating layer NPAS1, and the third insulating layer NPAS2 may be formed in a structure in which insulating layers are alternately or repeatedly stacked each other. In an embodiment, each of the first insulating layer RMPS, the second insulating layer NPAS1, and the third insulating layer NPAS2 may include at least one of silicon oxide ($SiO_x$), silicon nitride ($SiN_x$), and silicon oxynitride ($SiO_xN_y$). The first insulating layer RMPS, the second insulating layer NPAS1, and the third insulating layer NPAS2 may be made of a same material, or a portion of the first insulating layer RMPS, the second insulating layer NPAS1, and the third insulating layer NPAS2 may be made of a same material and another portion thereof may be made of different materials. In other embodiments, all of the first insulating layer RMPS, the second insulating layer NPAS1, and the third insulating layer NPAS2 may be made of materials different from one another.

Figure 10:
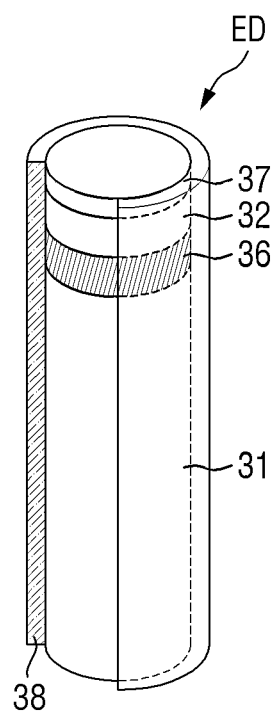
FIG. 10 is a schematic view illustrating a light emitting element according to an embodiment of the disclosure.

FIG. 10 is a schematic view illustrating a light emitting element according to an embodiment.

Referring to FIG. 10, the light emitting element ED may be a light emitting diode. For example, the light emitting element ED may be an inorganic light emitting diode made of an inorganic material with a size of a nano-meter to a micro-meter. The light emitting element ED may be aligned between two electrodes (e.g., the first and second electrodes RME) having polarities when an electric field is formed in a direction (e.g., a specific or selectable direction) between the two electrodes facing each other.

The light emitting element ED according to an embodiment may have a shape extended in a direction. The light emitting element ED may have a cylindrical shape, a rod shape, a wire shape, or a tube shape, but is not limited thereto. The light emitting element ED may have a polygonal pillar shape such as a cube, a cuboid, and a hexagonal pillar, or may have various shapes such as a shape extended in a direction, having an outer surface that is partially inclined.

The light emitting element ED may include a semiconductor layer doped with a conductivity type (e.g., p-type or n-type) dopant. The semiconductor layer may emit light of a wavelength band (e.g., a specific or selectable wavelength band) as an electrical signal applied from an external power source is transferred thereto. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N$ ($0<x<1$, $0<y<1$, $0<x+y<1$). For example, the first semiconductor layer 31 may be any one or more of AlGaInN, GaN, AlGaN, InGaN, AlN, and InN, which are doped with n-type dopants. The n-type dopants doped in the first semiconductor layer 31 may be Si, Ge, Sn, Se, etc.

The second semiconductor layer 32 may be disposed on the first semiconductor layer 31, and the light emitting layer 36 may be interposed (or disposed) between the first semiconductor layer 31 and the second semiconductor layer 32. The second semiconductor layer 32 may be a p-type semiconductor, and may include a semiconductor material having a chemical formula of $Al_xGa_yIn_{1-x-y}N$ ($0<x<1$, $0<y<1$, $0<x+y<1$). For example, the second semiconductor layer 32 may be any one or more of AlGaInN, GaN, AlGaN, InGaN, AlN, and InN, which are doped with p-type dopants. The p-type dopants doped in the second semiconductor layer 32 may be Mg, Zn, Ca, Ba, etc.

The first semiconductor layer 31 and the second semiconductor layer 32 may be formed of a single layer, but are not limited thereto. The first semiconductor layer 31 and the second semiconductor layer 32 may further include a larger number of layers, such as a clad layer or a tensile strain barrier reducing (TSBR) layer, depending on the material of the light emitting layer 36. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be any one or more of AlGaInN, GaN, AlGaN, InGaN, AlN, InN, and SLs, which are doped with n-type dopants. The semiconductor layer disposed between the second semiconductor layer 32 and the light emitting layer 36 may be any one or more of AlGaInN, GaN, AlGaN, InGaN, AlN, and InN, which are doped with p-type dopants.

The light emitting layer 36 may be disposed between the first semiconductor layer 31 and the second semiconductor layer 32. The light emitting layer 36 may include a material of a single or multiple quantum well structure. When the light emitting layer 36 includes a material of the multiple quantum well structure, quantum layers and well layers may be alternately stacked each other. The light emitting layer 36 may emit light by combination of electron-hole pairs in accordance with electrical signals applied through the first semiconductor layer 31 and the second semiconductor layer 32. The light emitting layer 36 may include a material such as AlGaN, AlGaInN, InGaN, and the like. For example, when the light emitting layer 36 has a stacked structure of quantum layers and well layers, which are alternately stacked each other in a multiple quantum well structure, the quantum layer may include a material such as AlGaN or AlGaInN, and the well layer may include a material such as GaN or AlInN.

The light emitting layer 36 may have a structure in which a semiconductor material having a big band gap energy and semiconductor materials having a small band gap energy are alternately stacked each other. The light emitting layer 36 may include group-III or group-V semiconductor materials depending on a wavelength band of light that is emitted. The light emitting layer 36 may emit light of a red or green wavelength band, as the case may be, without being limited to light of a blue wavelength band.

The electrode layer 37 may be an ohmic connection electrode, but is not limited thereto. The electrode layer 37 may be a Schottky connection electrode. The light emitting element ED may include at least one electrode layer 37. The light emitting element ED may include one or more electrode layers 37, but is not limited thereto. The electrode layer 37 may be omitted.

The electrode layer 37 may reduce resistance between the light emitting element ED and an electrode (e.g., the first electrode RME1 or the second electrode RME2) or a connection electrode (e.g., the first to fifth connection electrodes CNE1 to CNE5) when the light emitting element ED is electrically connected with the electrode or the connection electrode in the display device 10. The electrode layer 37 may include a metal having conductivity. For example, the electrode layer 37 may include at least one of Al, Ti, In, Au, Ag, ITO, IZO, and ITZO. However, the embodiments are not limited thereto.

The insulating layer 38 may be adjacent to (e.g., surround) outer surfaces of the semiconductor layers 31, 32, and 36 and the electrode layer 37. For example, the insulating layer 38 may be adjacent to (e.g., surround) at least an outer surface of the light emitting layer 36, and may expose ends (e.g., both ends) in a longitudinal direction of the light emitting element ED. Also, the insulating layer 38 may be formed with a rounded upper surface on a section in an area adjacent to at least one end of the light emitting element ED.

The insulating layer 38 may include materials having electrical insulation property. For example, the insulating layer 38 may include at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the embodiments are not limited thereto. The insulating layer 38 may be formed of a single layer, but is not limited thereto. In some embodiments, the insulating layer 38 may be formed of a multi-layered structure in which multiple layers are stacked each other.

The insulating layer 38 may protect the semiconductor layers 31, 32, and 36 and the electrode layer 37 of the light emitting element ED. The insulating layer 38 may prevent an electrical short that may occur in the light emitting layer 36 when the light emitting element ED is in contact with (e.g., directly in contact with) the electrode (e.g., the electrodes RME) to which the electrical signal is transferred. The insulating layer 38 may prevent light emitting efficiency of the light emitting element ED from being deteriorated.

Also, an outer surface of the insulating layer 38 may be surface-treated. The light emitting element ED may be sprayed and aligned onto the electrode in a dispersed state in an ink (e.g., a predetermined or selectable ink). The surface of the insulating layer 38 may be hydrophobic-treated or hydrophilic-treated. Thus, the light emitting element ED may be maintained to be dispersed in the ink without being condensed with another light emitting element ED adjacent thereto.

Hereinafter, description of a method of manufacturing a display device according to an embodiment is provided with reference to FIGS. 5 to 9, and 11 to 25 described above.

FIGS. 11, 14, 16, 19, 22 and 24 are schematic plan views illustrating process steps of a method of manufacturing a display device according to an embodiment of the disclosure. FIGS. 12, 13, 15, 17, 18, 23 and 25 are schematic cross-sectional views illustrating process steps of a method of manufacturing a display device according to an embodiment of the disclosure. FIG. 20 is a schematic cross-sectional view taken along line II-IF of FIG. 19. FIG. 21 is a schematic cross-sectional view taken along line of FIG. 19.

Figure 11:
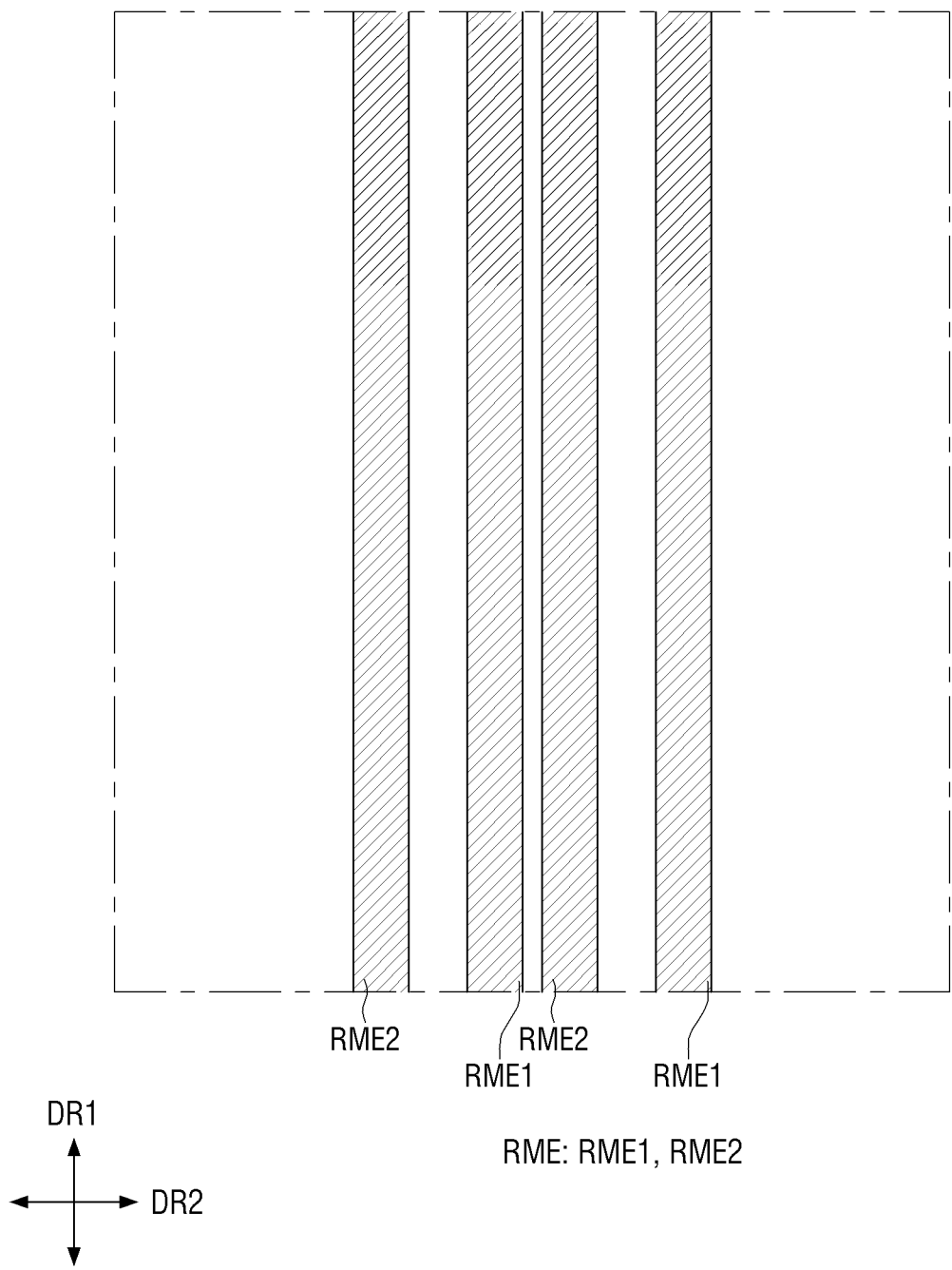
FIGS. 11, 14, 16, 19, 22 and 24 are schematic plan views illustrating process steps of a method of manufacturing a display device according to an embodiment of the disclosure.
Figure 12:
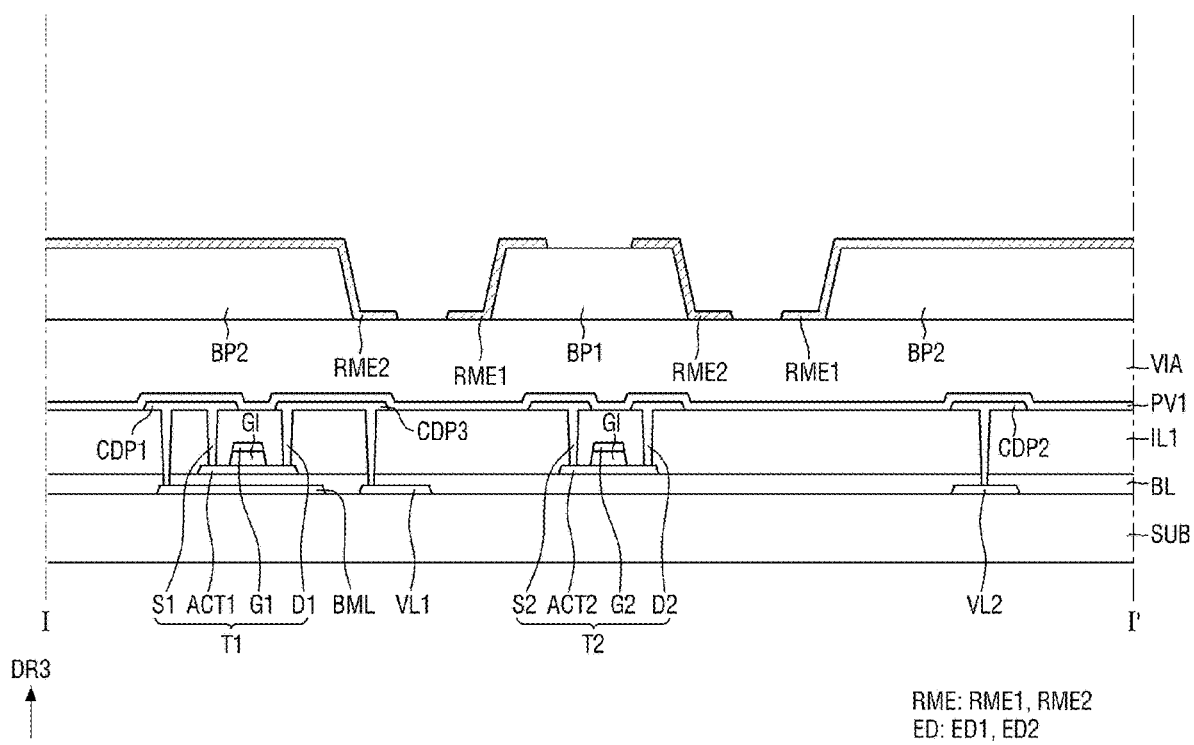
FIGS. 12, 13, 15, 17, 18, 23 and 25 are schematic cross-sectional views illustrating process steps of a method of manufacturing a display device according to an embodiment of the disclosure.

Referring to FIGS. 11 and 12, the bank layers BP1 and BP2 may be extended in the first direction DR1 and the second direction DR2 on the first substrate SUB, and adjacent to (e.g., surrounding) the subpixels SPXn. The first electrode RME1 may be extended from the subpixel SPXn on the bank layers BP1 and BP2 in the first direction DR1. The second electrode RME2 may be spaced apart from the first electrode RME1 on the bank layers BP1 and BP2 in the second direction DR2, and extended in the first direction DR1. For example, multiple first electrodes RME1 and multiple second electrodes RME2 may be provided in each subpixel SPXn.

Figure 13:
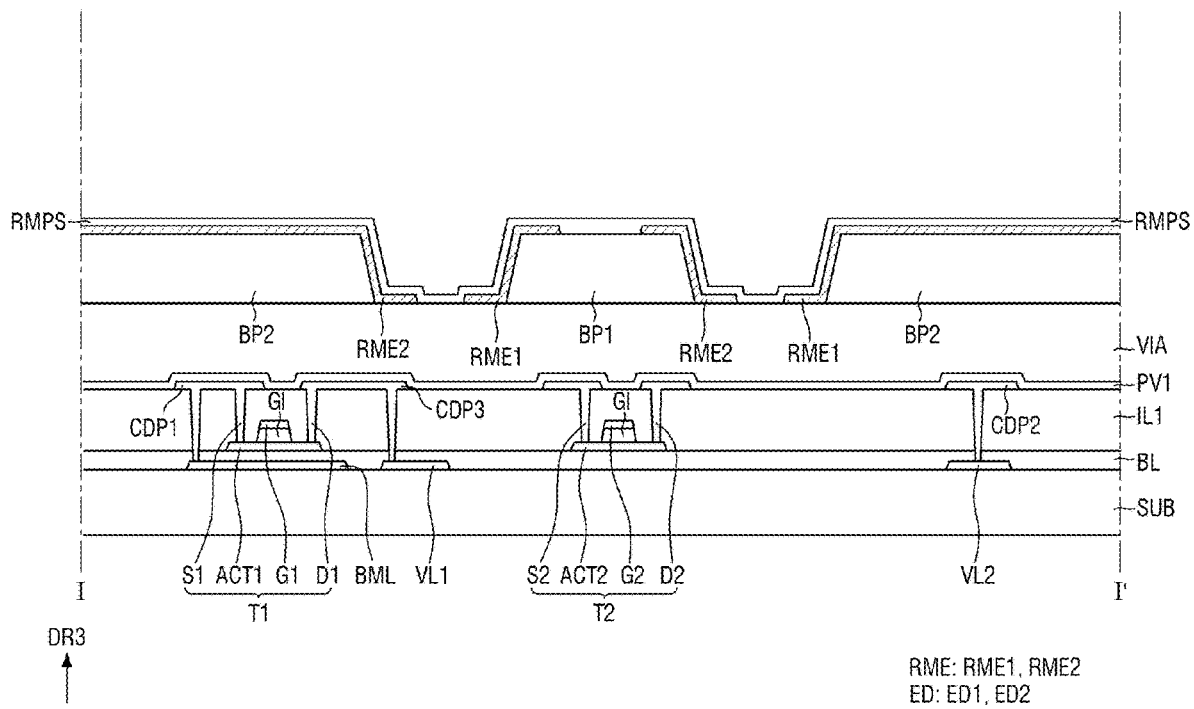

Subsequently, as shown in FIG. 13, a first insulating layer RMPS may be formed on the first and second electrodes RME1 and RME2. Each of the first insulating layer RMPS, a second insulating layer NPAS1 and a third insulating layer NPAS2 may include an inorganic insulating material or an organic insulating material. For example, each of the first insulating layer RMPS, the second insulating layer NPAS1, and the third insulating layer NPAS2 may include an inorganic insulating material, or the first insulating layer RMPS and the third insulating layer NPAS2 may include an inorganic insulating material but the second insulating layer NPAS1 may include an organic insulating material. Each of or at least one of the first insulating layer RMPS, the second insulating layer NPAS1, and the third insulating layer NPAS2 may be formed in a structure in which multiple insulating layers are alternately or repeatedly stacked each other. In an embodiment, each of the first insulating layer RMPS, the second insulating layer NPAS1, and the third insulating layer NPAS2 may be any one of silicon oxide ($SiO_x$), silicon nitride ($SiN_x$), and silicon oxynitride (Si- $O_xN_y$). The first insulating layer RMPS, the second insulating layer NPAS1, and the third insulating layer NPAS2 may be made of a same material. In other embodiments, a portion of the first insulating layer RMPS, the second insulating layer NPAS1, and the third insulating layer NPAS2 may be made of a same material, and another portion thereof may be made of different materials. In an embodiment, all of the first insulating layer RMPS, the second insulating layer NPAS1, and the third insulating layer NPAS2 may be made of different materials different from one another.

Figure 14:
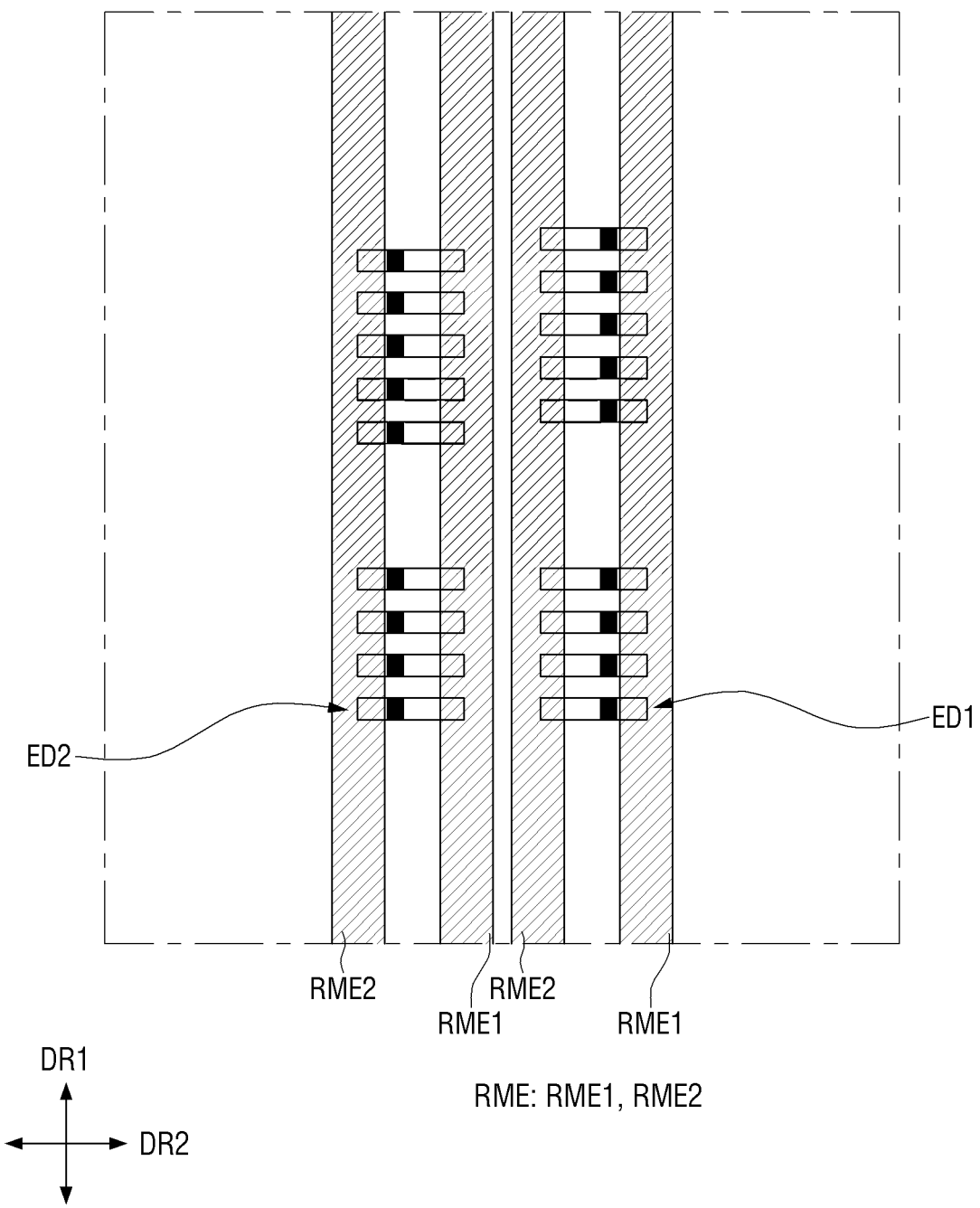
Figure 15:
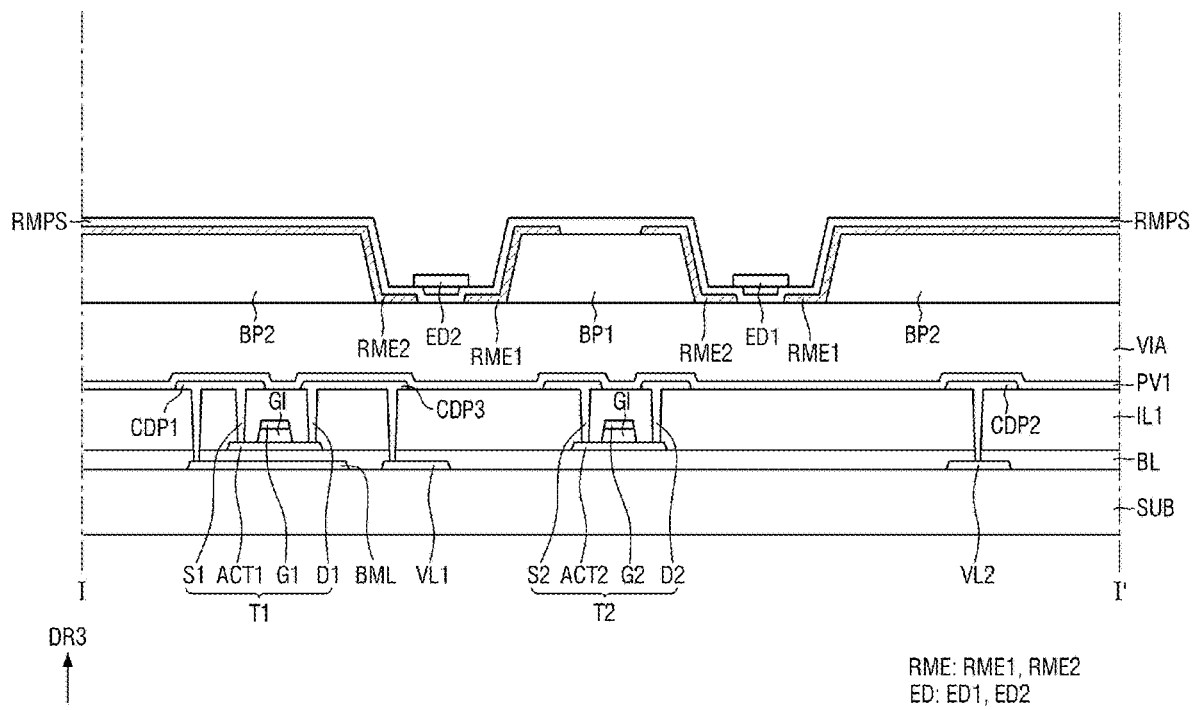

As shown in FIGS. 14 and 15, the light emitting element ED may be disposed between the first electrode RME1 and the second electrode RME2 on the first insulating layer RMPS, and include an end and another end opposite to the end. The light emitting element ED may include a first light emitting element ED1 and a second light emitting element ED2. The arrangement of the light emitting elements ED1 and ED2 and the electrodes RME1 and RME2 is described above with reference to FIGS. 5 to 9, and thus its detailed description will be omitted.

Figure 16:
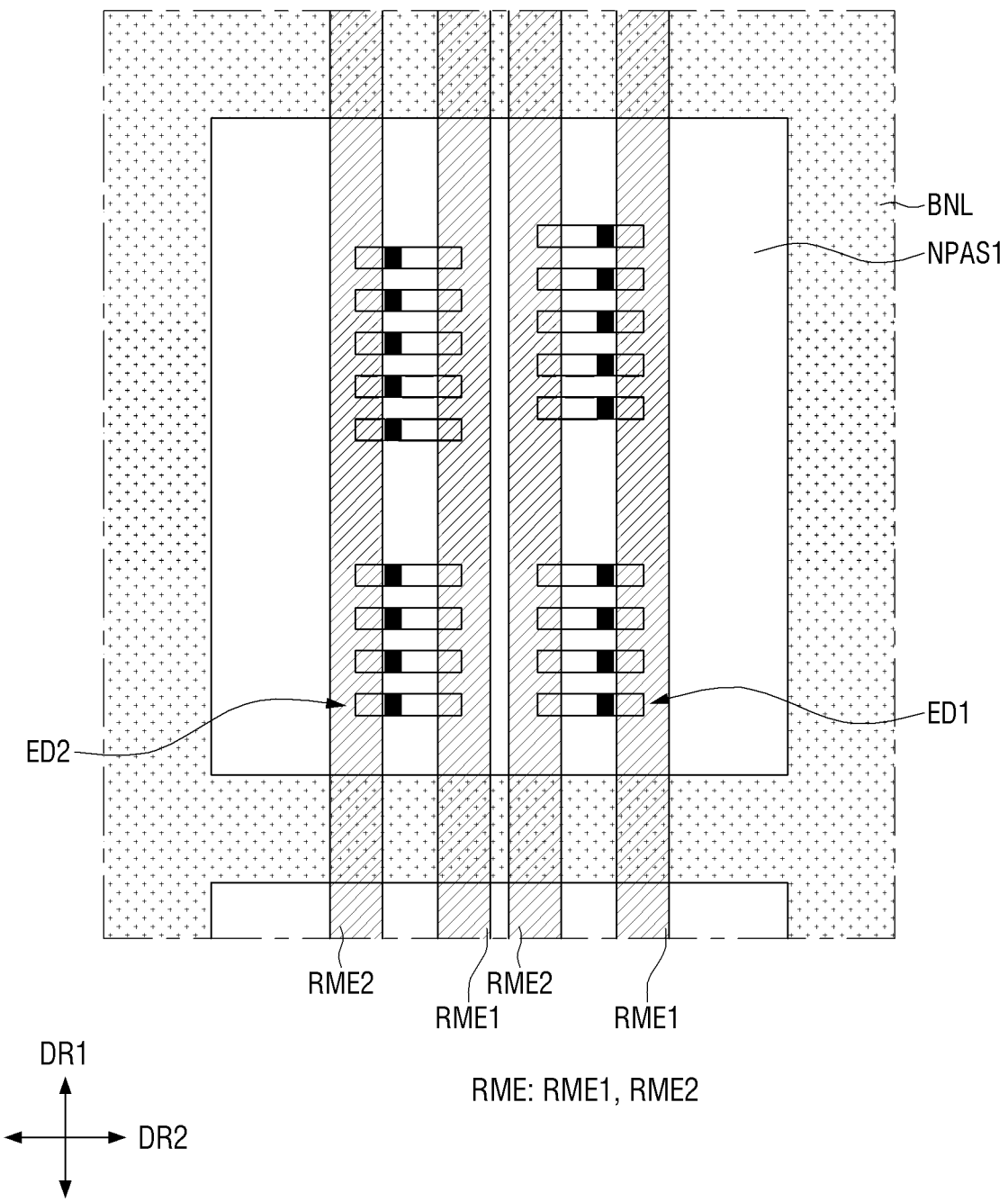
Figure 17:
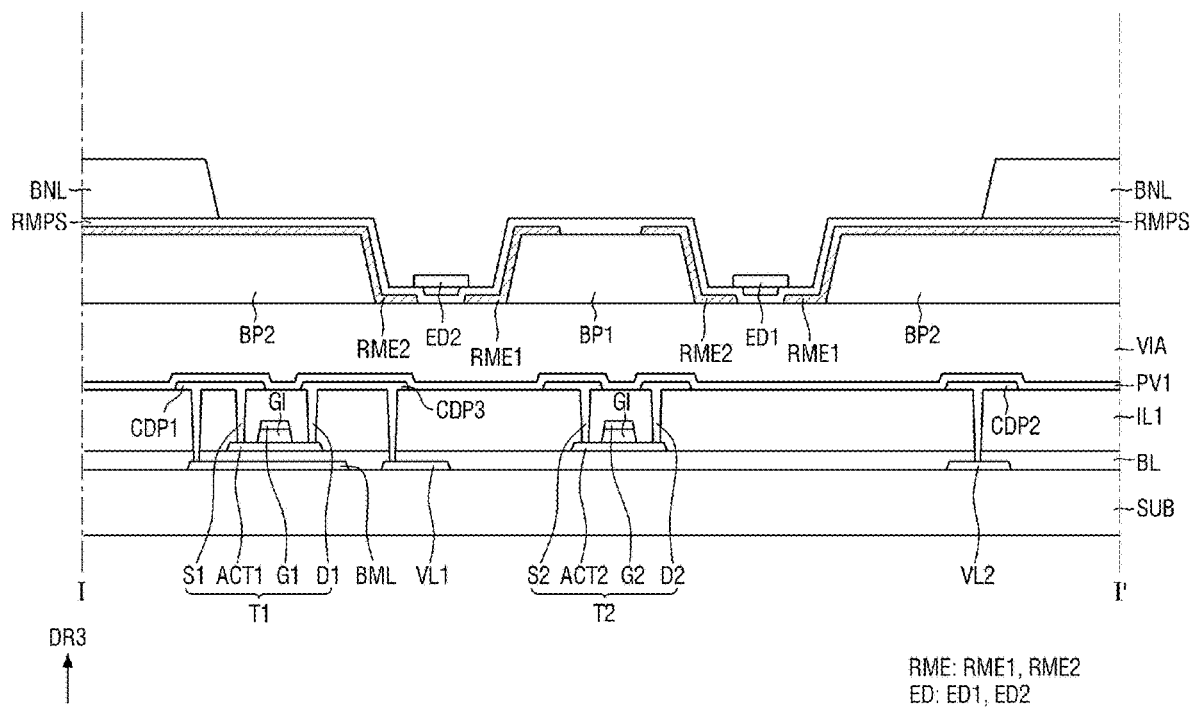

As shown in FIGS. 16 and 17, a bank layer BNL may be formed on the first insulating layer RMPS. The bank layer BNL may include an organic insulating material such as polyimide in the same manner as the bank patterns BP1 and BP2.

Figure 18:
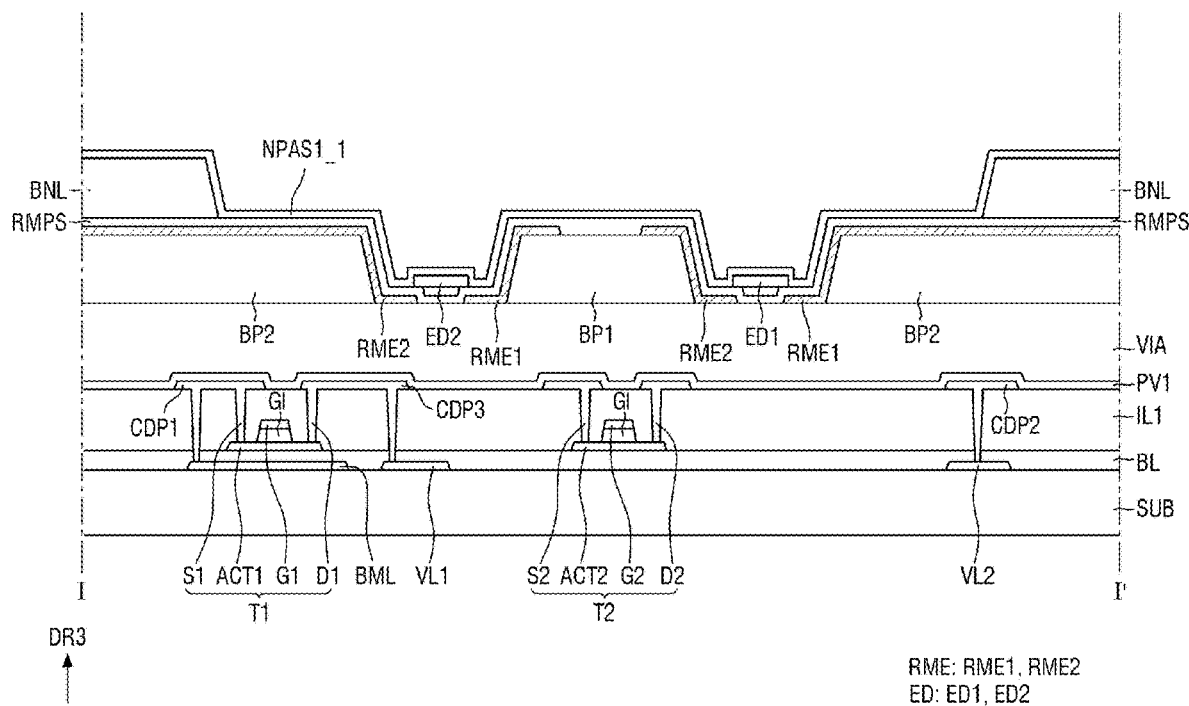

As shown in FIG. 18, a second insulating layer NPAS1_1 may be formed on (e.g., formed entirely on) the bank layer BNL, the first insulating layer RMPS, and the light emitting element ED.

Figure 19:
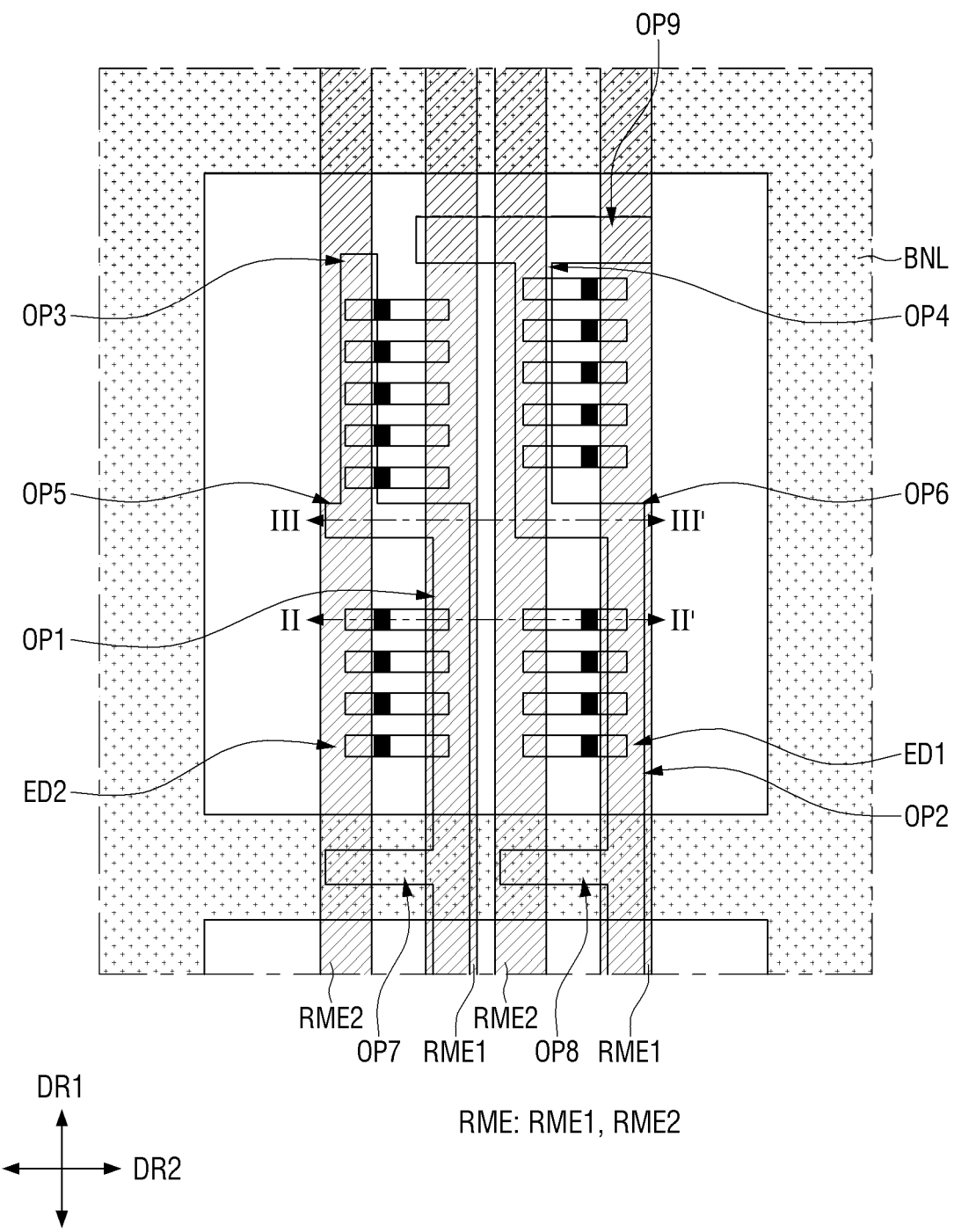
Figure 20:
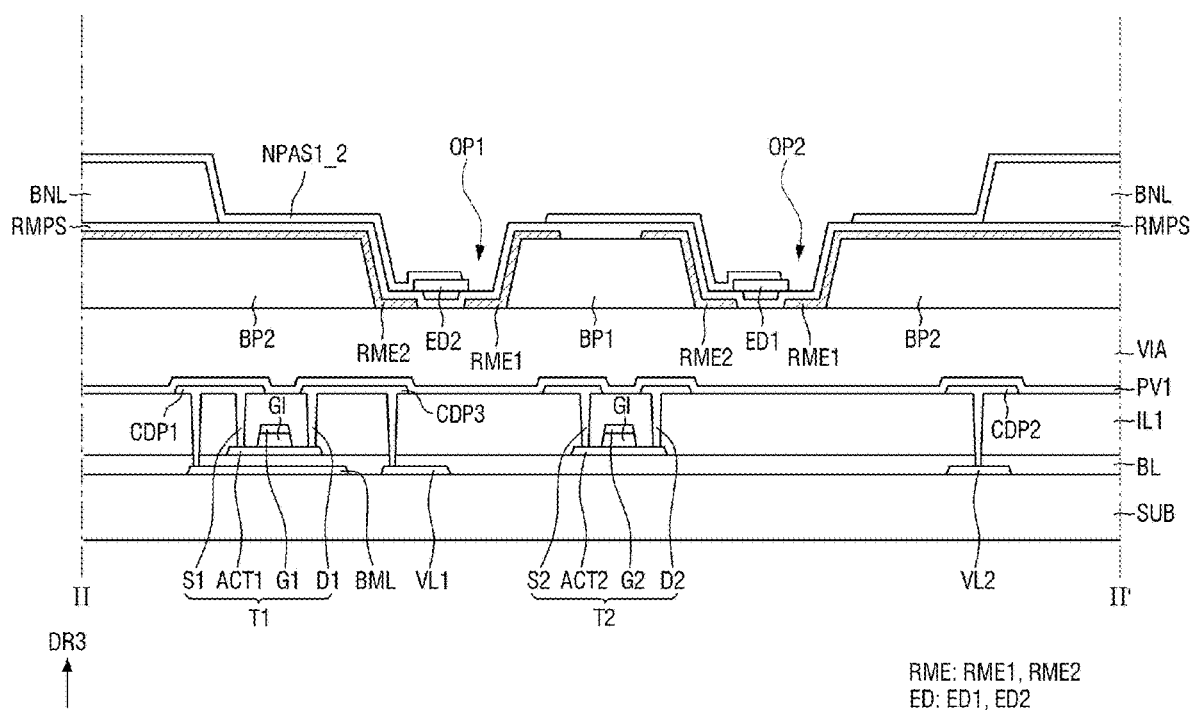
FIG. 20 is a schematic cross-sectional view taken along line II-IF of FIG. 19.
Figure 21:
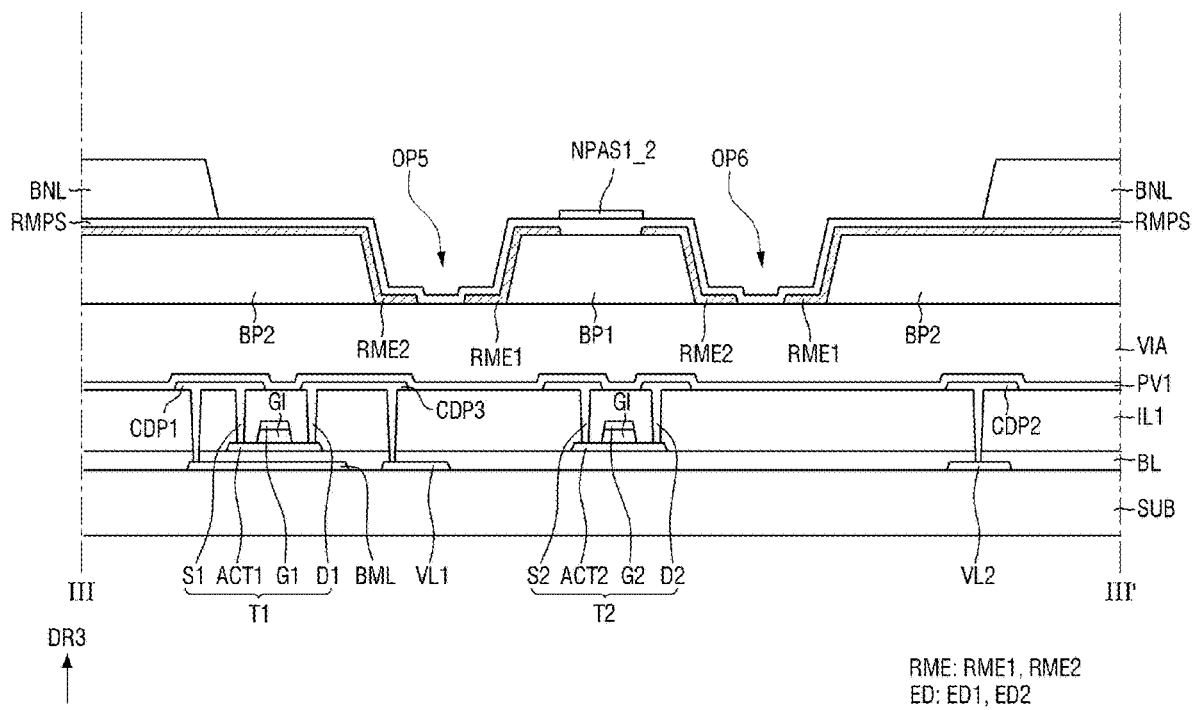
FIG. 21 is a schematic cross-sectional view taken along line of FIG. 19.

As shown in FIGS. 19 to 21, a second insulating layer NPAS1_2 including first, second, third, fourth, fifth, sixth, seventh, eighth, and ninth open portions OP1, OP2, OP3, OP4, OP5, OP6, OP7, OP8, and OP9 may be formed. The first, second, third, fourth, fifth, sixth, seventh, eighth, and ninth open portions OP1, OP2, OP3, OP4, OP5, OP6, OP7, OP8, and OP9 of the second insulating layer NPAS1_2 may be formed by dry etching or wet etching.

The third open portion OP3 may expose an end of the second light emitting element ED2, the first open portion OP1 may expose another end of the second light emitting element ED2, the fourth open portion OP4 may expose an end of the first light emitting element ED1, and the second open portion OP2 may expose another end of the first light emitting element ED1. The first connection electrode CNE1 and the second light emitting elements ED2 may be electrically connected with the second connection electrode CNE2 and the first light emitting elements ED1 through the third, first, fourth, and second open portions OP3, OP1, OP4, OP2, respectively.

Figure 22:
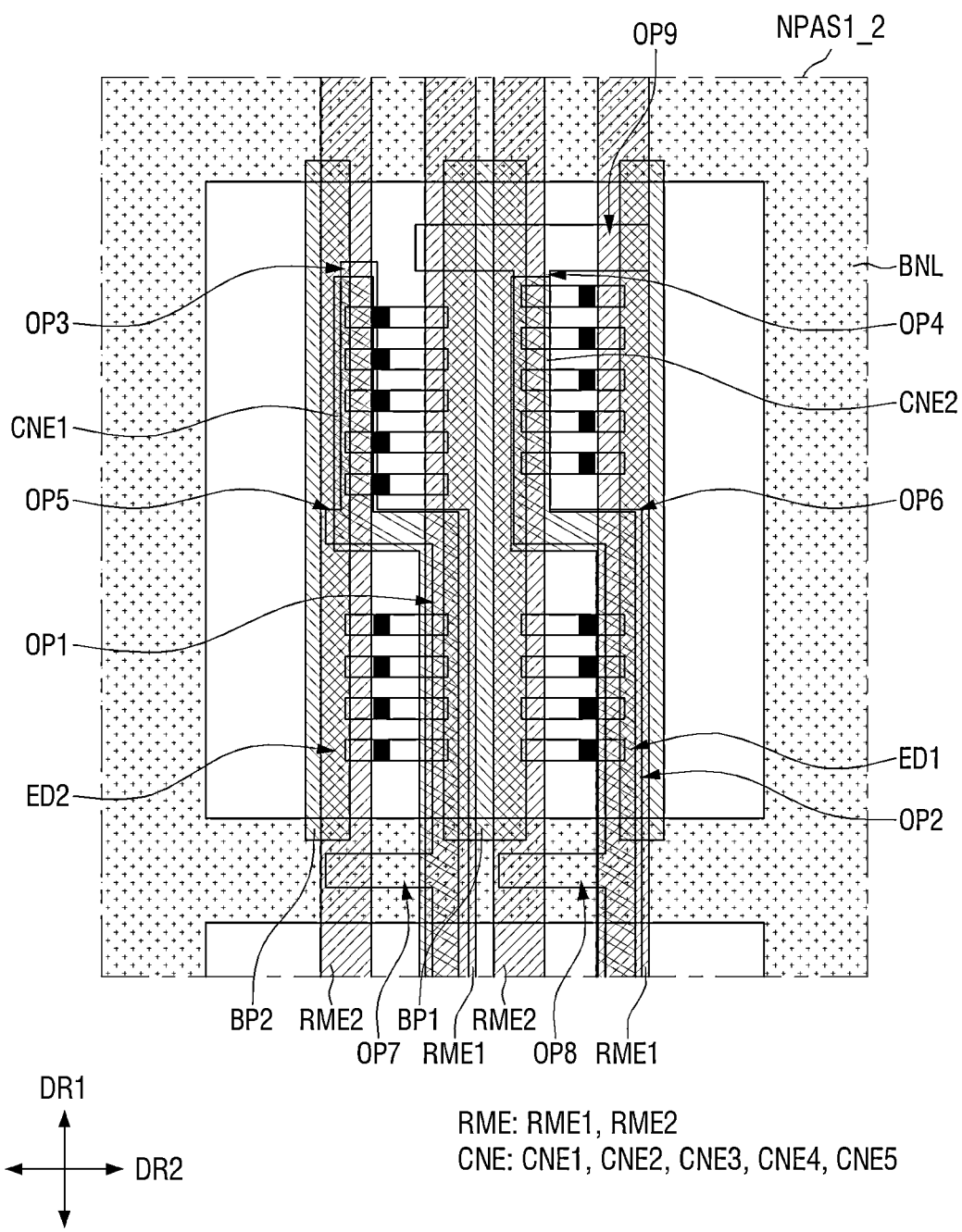
Figure 23:
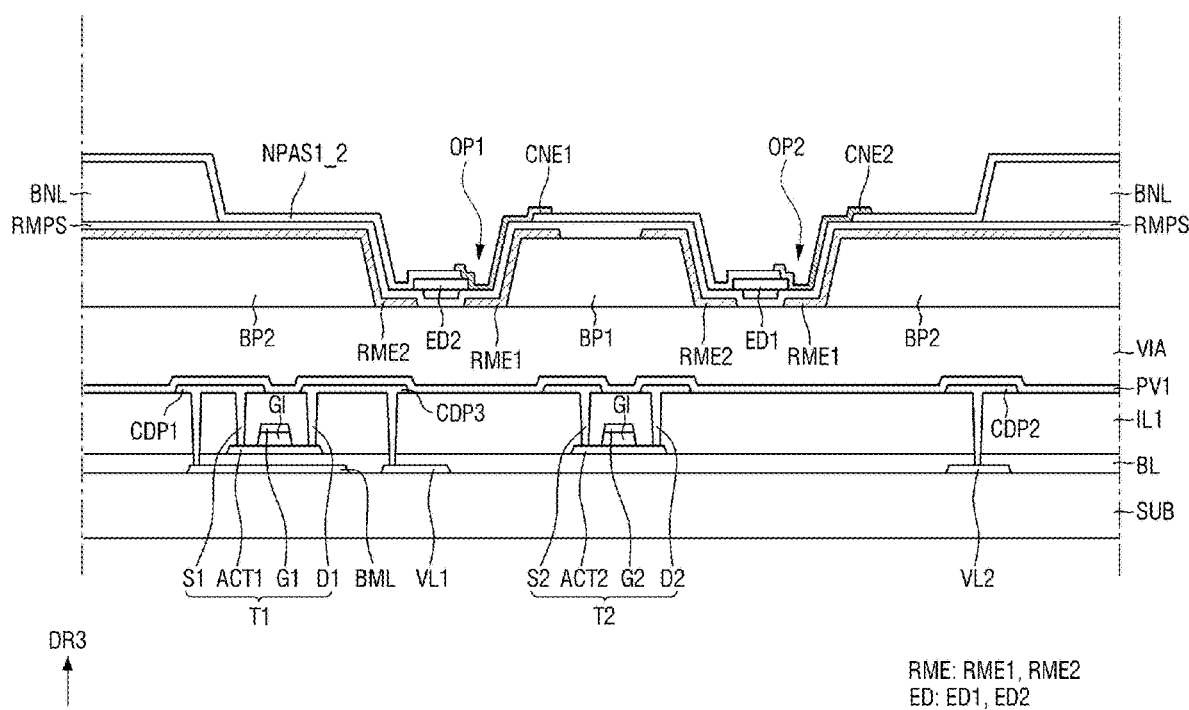

Referring to FIGS. 22 and 23, a first connection conductive layer may be formed on the second insulating layer NPAS1, the light emitting elements ED1 and ED2, and the first insulating layer RMPS. The first connection conductive layer may be etched to form the first connection electrode CNE1 and the second connection electrode CNE2. In the process of etching the first connection conductive layer except an area in which the first connection electrode CNE1 and the second connection electrode CNE2 are to be formed, a large amount of light emitting elements ED or particles, which are agglomerated on the fifth, sixth, seventh, eighth, and ninth open portions OP5, OP6, OP7, OP8, and OP9, may be removed. Thus, the connection electrode CNE may be prevented from being disconnected by a large amount of the light emitting elements ED or particles, which are agglomerated.

Figure 24:
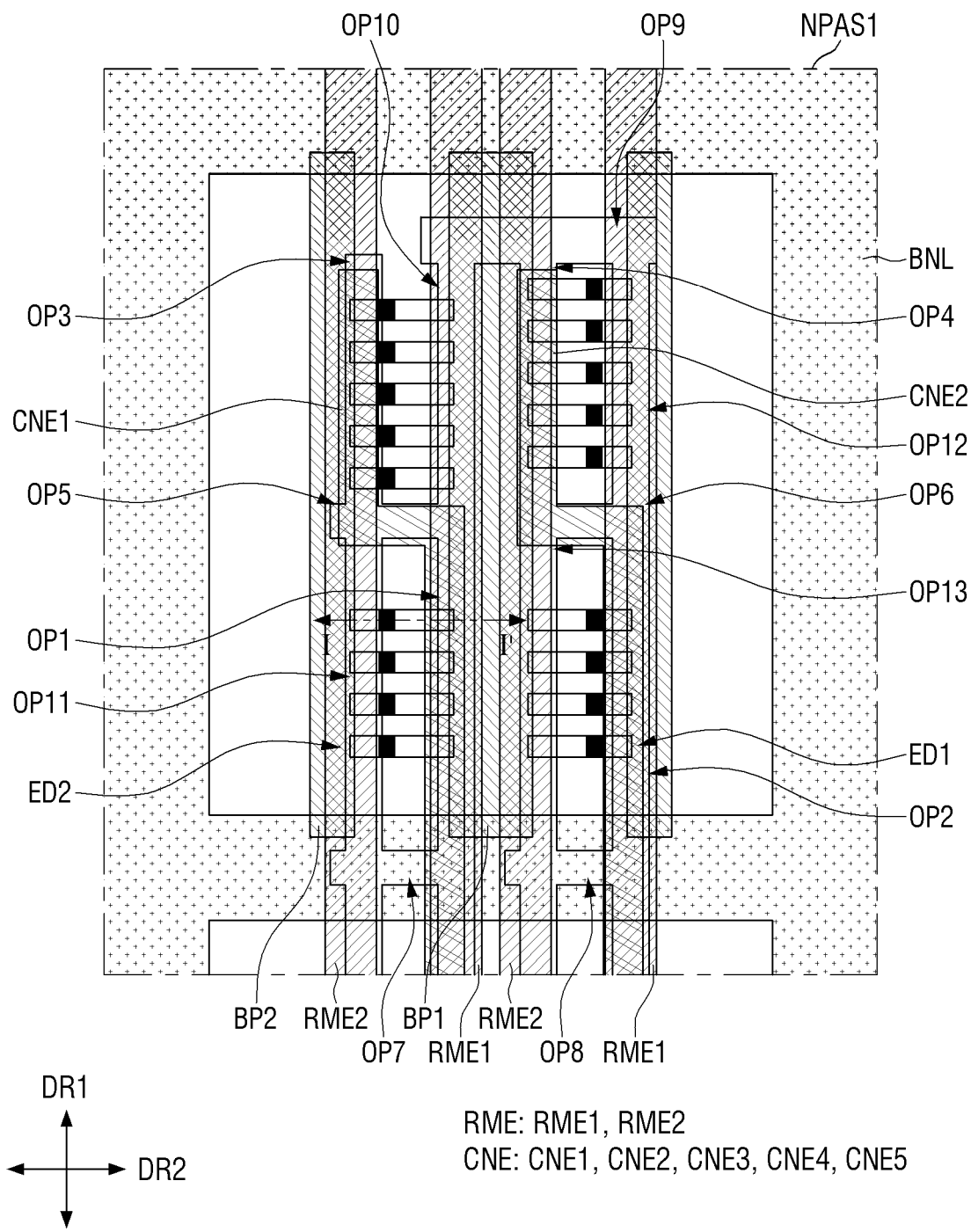
Figure 25:
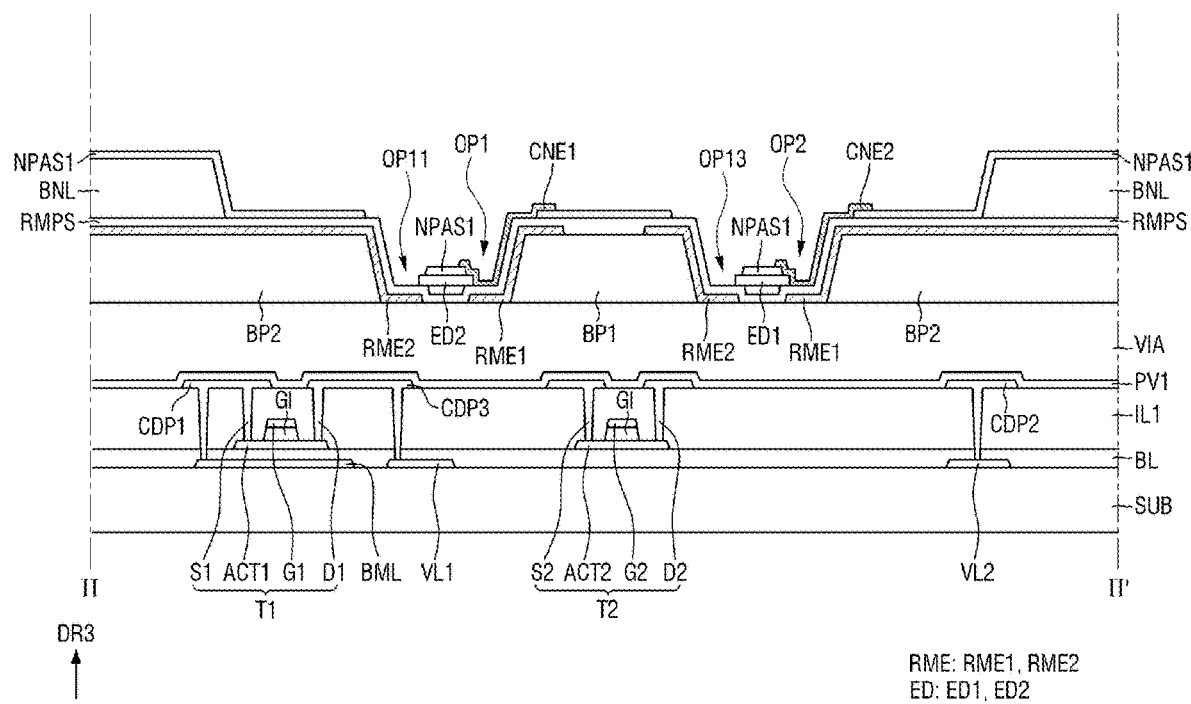

Referring to FIGS. 24 and 25, the tenth, eleventh, twelfth, and thirteenth open portions OP10, OP11, OP12, and OP13 may be additionally formed on the second insulating layer NPAS1.

The third insulating layer NPAS2 of FIG. 9 may be formed on the second insulating layer NPAS1.

The third to fifth connection electrodes CNE3, CNE4 and CNE5 may be formed on the third insulating layer NPAS2, the second insulating layer NPAS1, the light emitting elements ED1 and ED2, and the first insulating layer RMPS.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a bank layer extended in a first direction and a second direction intersecting the first direction on a substrate, and adjacent to a plurality of subpixels;
   at least one first electrode extended in the first direction from each of the plurality of subpixels on the bank layer;
   at least one second electrode spaced apart from the at least one first electrode on the bank layer in the second direction and extended in the first direction;
   a first insulating layer on the at least one first electrode and the at least one second electrode;
   a light emitting element disposed between the at least one first electrode and the at least one second electrode on the first insulating layer, the light emitting element including:
      an end; and
      another end opposite to the end; and
   a second insulating layer disposed on the light emitting element and exposing the end and the another end of the light emitting element,
   wherein the second insulating layer includes:
      a first main open portion exposing the end of the light emitting element and extended in the first direction;
      a second main open portion exposing the another end of the light emitting element and extended in the first direction; and
      a sub-open portion connecting the first main open portion with the second main open portion in a plan view and extended in the second direction.

2. The display device of claim 1, wherein
   the first main open portion overlaps the at least one second electrode in a plan view, and
   the second main open portion overlaps the at least one first electrode in a plan view.

3. The display device of claim 2, wherein
   the at least one second electrode includes a plurality of second electrodes, and
   the at least one first electrode is disposed between adjacent ones of the plurality of second electrodes adjacent to each other.

4. The display device of claim 3, wherein
the at least one first electrode includes a plurality of first electrodes, and
a second electrode of the plurality of second electrodes is disposed between adjacent ones of the plurality of first electrodes adjacent to each other.

5. The display device of claim 4, wherein the sub-open portion includes:
a first sub-open portion disposed between a second electrode of the plurality of second electrodes at another side of each of the plurality of subpixels in the second direction and a first electrode of the plurality of first electrodes at the another side of each of the plurality of subpixels in the second direction; and
a second sub-open portion disposed between a second electrode of the plurality of second electrodes at a side of each of the plurality of subpixels in the second direction and a first electrode of the plurality of first electrodes at the side of each of the plurality of subpixels in the second direction.

6. The display device of claim 5, further comprising:
a first connection electrode on the second insulating layer; and
a second connection electrode spaced apart from the first connection electrode, wherein
the first connection electrode includes:
a 1-1-th electrode portion extended in the first direction;
a 1-2-th electrode portion extended in the first direction; and
a 1-3-th electrode portion electrically connecting the 1-1-th electrode portion with the 1-2-th electrode portion,
the 1-1-th electrode portion overlaps an upper end of the second electrode of the plurality of second electrodes at the another side of each of the plurality of subpixels in the second direction, and
the 1-2-th electrode portion overlaps a lower end of the first electrode of the plurality of first electrodes at the another side of each of the plurality of subpixels in the second direction.

7. The display device of claim 6, wherein the sub-open portion of the second insulating layer further includes a third sub-open portion overlapping the 1-3-th electrode portion in a plan view.

8. The display device of claim 7, wherein
the second connection electrode includes:
a 2-1-th electrode portion extended in the first direction;
a 2-2-th electrode portion extended in the first direction; and
a 2-3-th electrode portion electrically connecting the 2-1-th electrode portion with the 2-2-th electrode portion,
the 2-1-th electrode portion overlaps an upper end of the second electrode of the plurality of second electrodes at the side of each of the plurality of subpixels in the second direction, and
the 2-2-th electrode portion overlaps a lower end of the first electrode of the plurality of first electrodes at the side of each of the plurality of subpixels in the second direction.

9. The display device of claim 8, wherein the sub-open portion of the second insulating layer further includes a fourth sub-open portion overlapping the 2-3-th electrode portion in a plan view.

10. The display device of claim 9, wherein the sub-open portion of the second insulating layer further includes a fifth sub-open portion extended in the second direction and overlapping the plurality of first electrodes and the second electrode of the plurality of second electrodes positioned at the side of each of the plurality of subpixels in the second direction in a plan view.

11. The display device of claim 10, further comprising:
a third connection electrode disposed on the first connection electrode and the second connection electrode, wherein
the third connection electrode includes:
a 3-1-th electrode portion between the 1-1-th electrode portion and the 2-1-th electrode portion;
a 3-2-th electrode portion spaced apart from the 3-1-th electrode portion; and
a 3-3-th electrode portion electrically connecting the 3-1-th electrode portion with the 3-2-th electrode portion, and
the 2-1-th electrode portion is disposed between the 3-2-th electrode portion and the 3-1-th electrode portion.

12. The display device of claim 11, wherein the fifth sub-open portion overlaps the 3-3-th electrode portion in a plan view.

13. A method of manufacturing a display device, the method comprising:
forming a bank layer extended in a first direction and a second direction intersecting the first direction on a substrate, and adjacent to a plurality of subpixels;
forming at least one first electrode extended in the first direction from each of the plurality of subpixels on the bank layer and at least one second electrode spaced apart from the at least one first electrode on the bank layer in the second direction and extended in the first direction;
forming a first insulating layer on the at least one first electrode and the at least one second electrode;
disposing a light emitting element between the at least one first electrode and the at least one second electrode on the first insulating layer, the light emitting element including:
an end; and
another end opposite to the end; and
forming a second insulating layer on the light emitting element,
wherein the forming of the second insulating layer includes:
forming a first main open portion exposing the end of the light emitting element, and extended in the first direction; and
forming a sub-open portion extended and diverged from the first main open portion in the second direction in a plan view.

14. The method of claim 13, wherein the first main open portion overlaps the at least one second electrode in a plan view.

15. The method of claim 14, wherein
the at least one second electrode includes a plurality of second electrodes,
the at least one first electrode is disposed between adjacent ones of the plurality of second electrodes adjacent to each other,
the at least one first electrode includes a plurality of first electrodes, and
a second electrode of the plurality of second electrodes is disposed between adjacent ones of the plurality of first electrodes adjacent to each other.

16. The method of claim 15, wherein the sub-open portion includes:
- a first sub-open portion disposed between a second electrode of the plurality of second electrodes at another side of each of the plurality of subpixels in the second direction and a first electrode of the plurality of first electrodes at the another side of each of the plurality of subpixels in the second direction; and
- a second sub-open portion disposed between a second electrode of the plurality of second electrodes at a side of each of the plurality of subpixels in the second direction and a first electrode of the plurality of first electrodes at the side of each of the plurality of subpixels in the second direction.

17. The method of claim 16, further comprising:
forming a first connection electrode on the second insulating layer and a second connection electrode spaced apart from the first connection electrode after the forming of the second insulating layer, wherein
the first connection electrode includes:
- a 1-1-th electrode portion extended in the first direction;
- a 1-2-th electrode portion extended in the first direction; and
- a 1-3-th electrode portion electrically connecting the 1-1-th electrode portion with the 1-2-th electrode portion, the 1-1-th electrode portion overlaps an upper end of the second electrode of the plurality of second electrodes at the another side of each of the plurality of subpixels in the second direction, and the 1-2-th electrode portion overlaps a lower end of the first electrode of the plurality of first electrodes at the another side of each of the plurality of subpixels in the second direction.

18. The method of claim 17, wherein the sub-open portion of the second insulating layer further includes a third sub-open portion overlapping the 1-3-th electrode portion in a plan view.

19. The method of claim 18, wherein
the second connection electrode includes:
- a 2-1-th electrode portion extended in the first direction;
- a 2-2-th electrode portion extended in the first direction; and
- a 2-3-th electrode portion electrically connecting the 2-1-th electrode portion with the 2-2-th electrode portion, the 2-1-th electrode portion overlaps an upper end of the second electrode of the plurality of second electrodes at the side of each of the plurality of subpixels in the second direction, and the 2-2-th electrode portion overlaps a lower end of the first electrode of the plurality of first electrodes at the side of each of the plurality of subpixels in the second direction.

20. The method of claim 19, wherein the sub-open portion of the second insulating layer further includes:
- a fourth sub-open portion overlapping the 2-3-th electrode portion in a plan view; and
- a fifth sub-open portion extended in the second direction and overlapping the plurality of first electrodes and the second electrode of the plurality of second electrodes positioned at the side of each of the plurality of subpixels in the second direction in a plan view.

* * * * *